United States Patent
Mizukoshi et al.

(10) Patent No.: US 7,811,835 B2
(45) Date of Patent: Oct. 12, 2010

(54) METHOD FOR PROCESSING A BASE THAT INCLUDES CONNECTING A FIRST BASE TO A SECOND BASE WITH AN INSULATING FILM

(75) Inventors: Masataka Mizukoshi, Kawasaki (JP); Nobuhiro Imaizumi, Kawasaki (JP); Yoshikatsu Ishizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/403,283

(22) Filed: Mar. 12, 2009

(65) Prior Publication Data

US 2009/0181497 A1 Jul. 16, 2009

Related U.S. Application Data

(60) Division of application No. 11/196,487, filed on Aug. 4, 2005, now Pat. No. 7,514,295, which is a continuation-in-part of application No. 11/017,875, filed on Dec. 22, 2004, now abandoned.

(30) Foreign Application Priority Data

| Aug. 5, 2004 | (JP) | ............................... 2004-229921 |
| May 31, 2005 | (JP) | ............................... 2005-159364 |

(51) Int. Cl.
H01L 21/58 (2006.01)
(52) U.S. Cl. .................. 438/3; 438/125; 257/E21.511; 29/830
(58) Field of Classification Search .................. 438/125
See application file for complete search history.

(56) References Cited

U.S. PATENT DOCUMENTS 5,925,936 A 7/1999 Yamaji (Continued)

FOREIGN PATENT DOCUMENTS

JP 9-237806 9/1997

(Continued)

OTHER PUBLICATIONS

USPTO, Notice of Allowance, Notice of Allowability, Examiner's Amendment, Examiner's Statement of Reasons for Allowance, Nov. 20, 2008, in continuation-in-part U.S. Appl. No. 11/196,487 [now U.S. Patent No. 7,514,295].

(Continued)

*Primary Examiner*—Stephen W Smoot
(74) *Attorney, Agent, or Firm*—Fujitsu Patent Center

(57) ABSTRACT

The present invention realizes a semiconductor device of high reliability which allows metal terminals which have a uniform height, are flat and smooth to be formed under low load and at low costs and to be mounted with low damage. The electrodes 5 and the insulating film 6 are both formed of materials having the property that they are solid and do not exhibit the adhesiveness at room temperature and exhibit the adhesiveness at a temperature not lower than a first temperature and cure at a temperature not lower than a second temperature higher than the first temperature. The surfaces of the electrodes 5 and the insulating film 6 of a semiconductor chip 1a are planarized in continuously flat with a hard cutting tool, as of diamond or others.

7 Claims, 26 Drawing Sheets

U.S. PATENT DOCUMENTS

| | | | |
|---|---|---|---|
| 6,260,264 | B1 | 7/2001 | Chen et al. |
| 7,402,461 | B2 | 7/2008 | Mizukoshi et al. |
| 7,514,295 | B2 | 4/2009 | Mizukoshi et al. |

FOREIGN PATENT DOCUMENTS

| | | | |
|---|---|---|---|
| JP | 10-112477 | A * | 4/1998 |
| JP | 11-121527 | | 4/1999 |
| JP | 11-274241 | | 10/1999 |
| JP | 2000-260817 | | 9/2000 |
| JP | 2001144141 | A | 5/2001 |
| JP | 2001-298146 | | 10/2001 |
| JP | 2002-252245 | | 9/2002 |
| JP | 2002-368032 | | 12/2002 |
| JP | 2003-258034 | | 9/2003 |

OTHER PUBLICATIONS

USPTO, Non-Final Office Action, Apr. 1, 2008, in continuation-in-part U.S. Appl. No. 11/196,487 [now U.S. Patent No. 7,514,295].

USPTO, Restriction Requirement, Jan. 16, 2008, in continuation-in-part U.S. Appl. No. 11/196,487 [now U.S. Patent No. 7,514,295].

USPTO, Non-Final Rejection, Jan. 14, 2010, in co-pending U.S. Appl. No. 12/403,252 [pending].

USPTO, Restriction Requirement, Dec. 19, 2006, in parent (section 120 priority) U.S. Appl. No. 11/017,875 [abandoned].

USPTO, (SMOOT) Notice of Allowance and Examiner's Statement of Reasons for Allowance mailed Jun. 7, 2010, in co-pending U.S. Appl. No. 12/403,252 [pending].

* cited by examiner

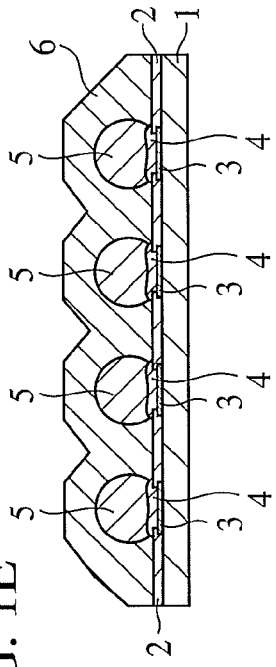
FIG. 1E
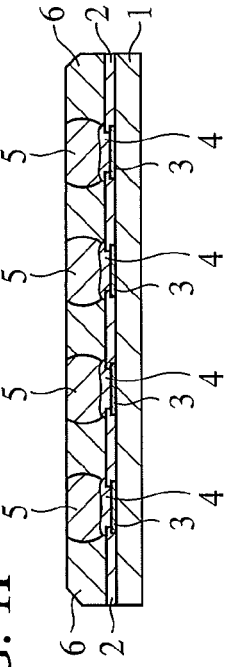
FIG. 1F
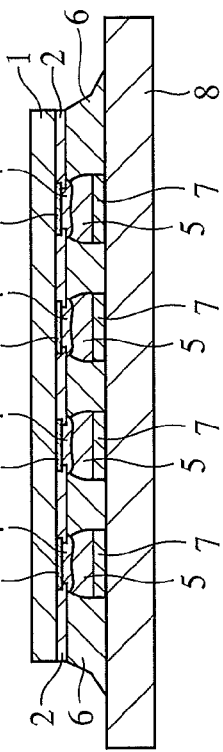
FIG. 1G
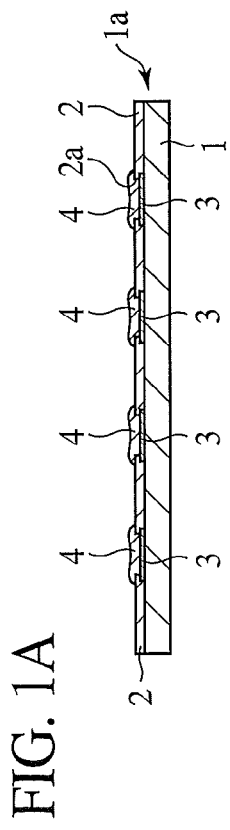
FIG. 1A
FIG. 1B
FIG. 1C
FIG. 1D

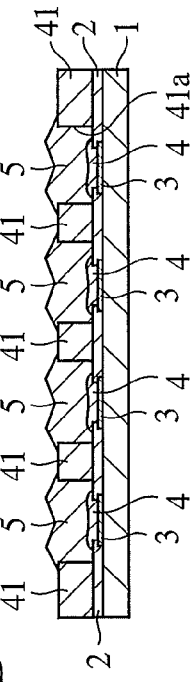
FIG. 4A
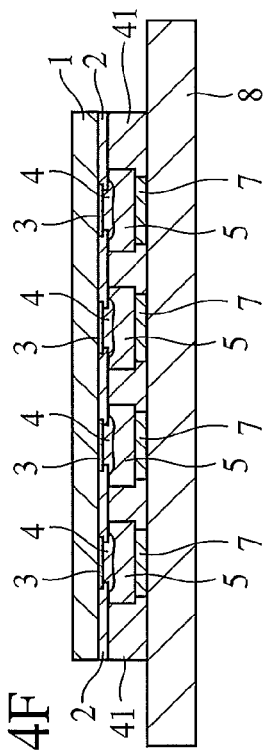
FIG. 4B
FIG. 4C
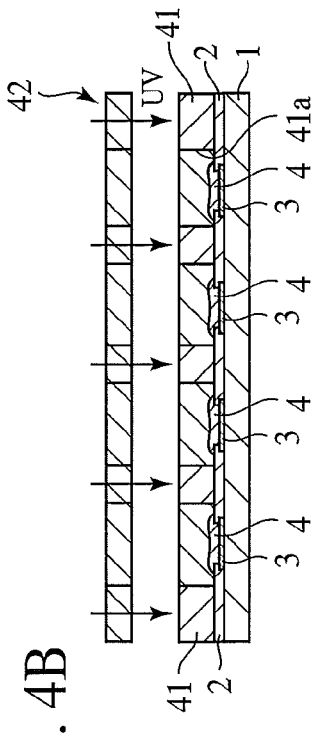
FIG. 4D
FIG. 4E
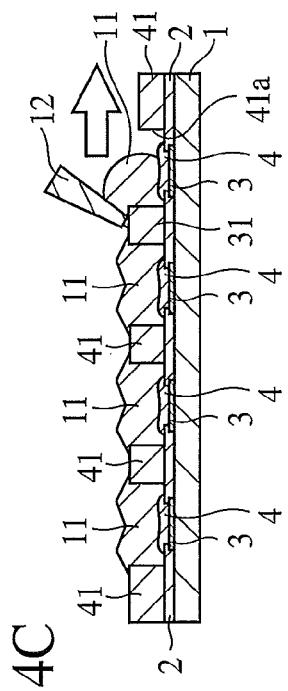
FIG. 4F

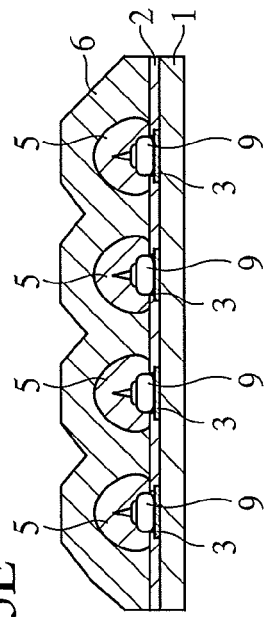
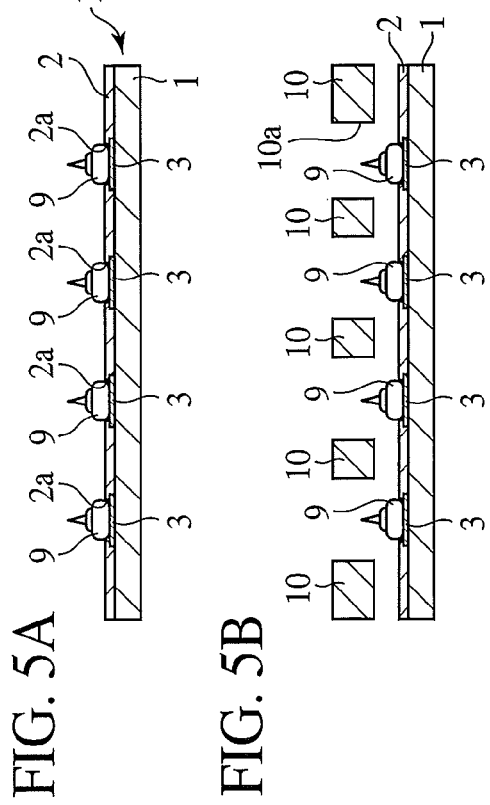
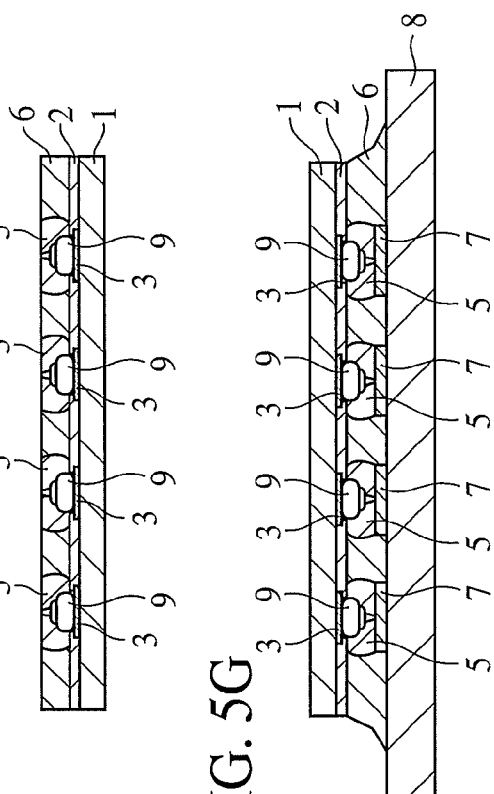
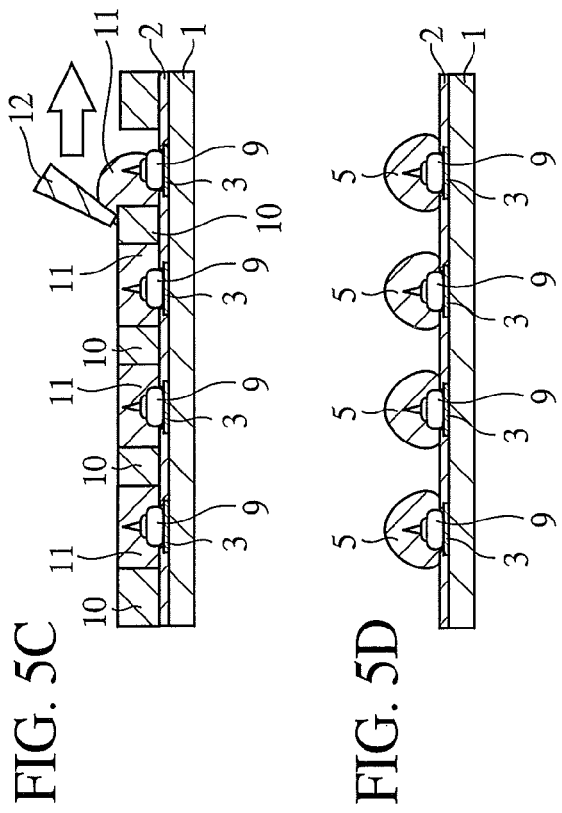
FIG. 5A
FIG. 5B
FIG. 5C
FIG. 5D
FIG. 5E
FIG. 5F
FIG. 5G

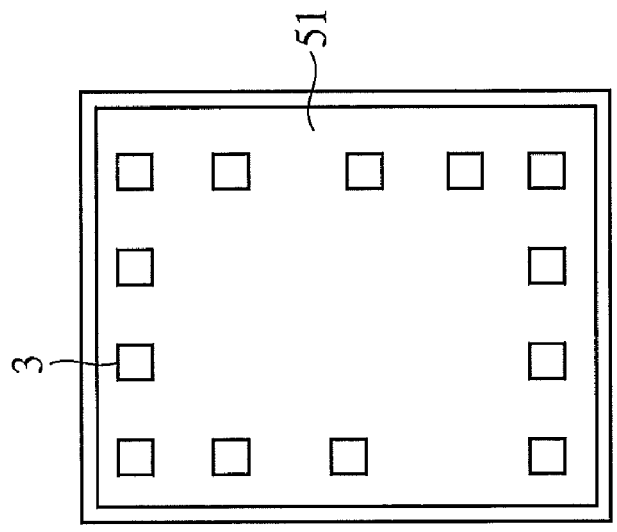
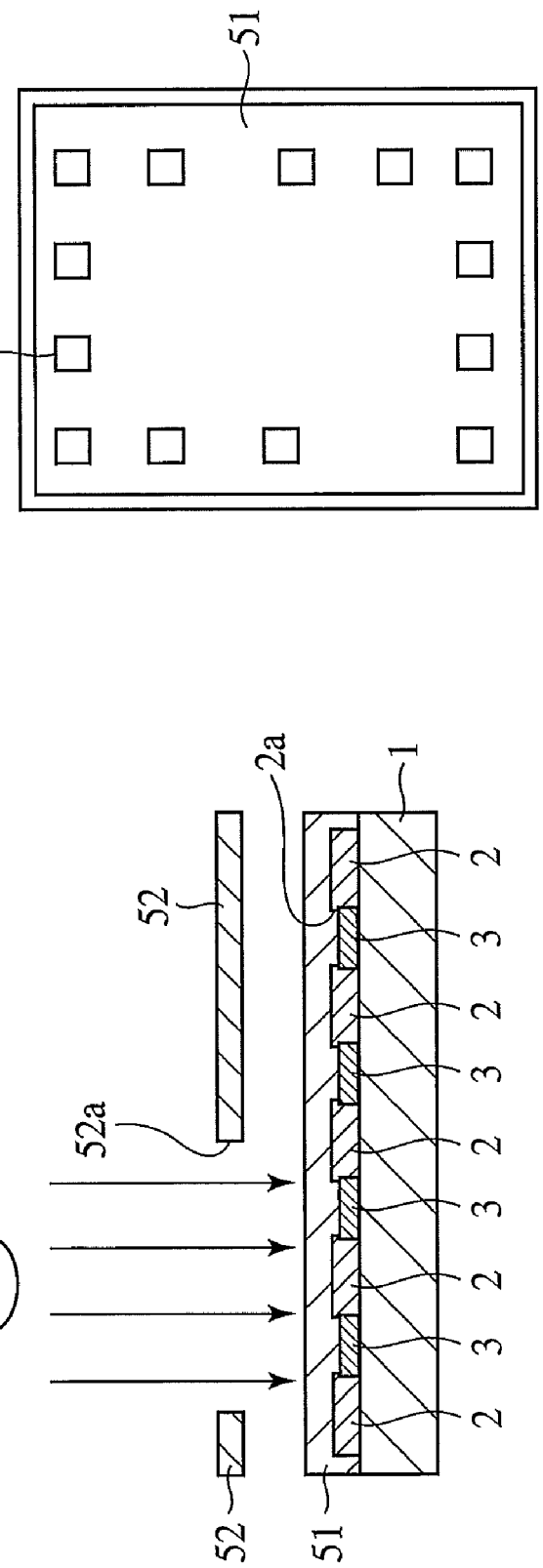

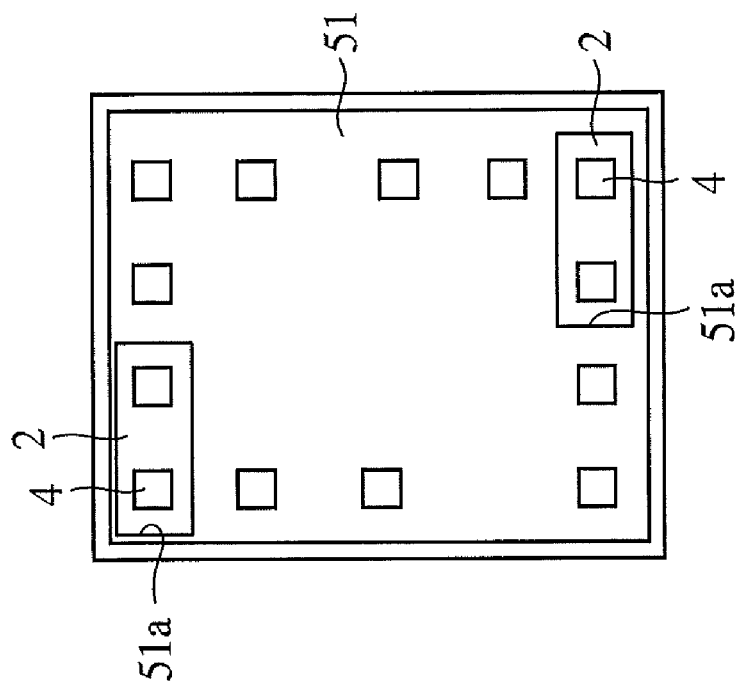
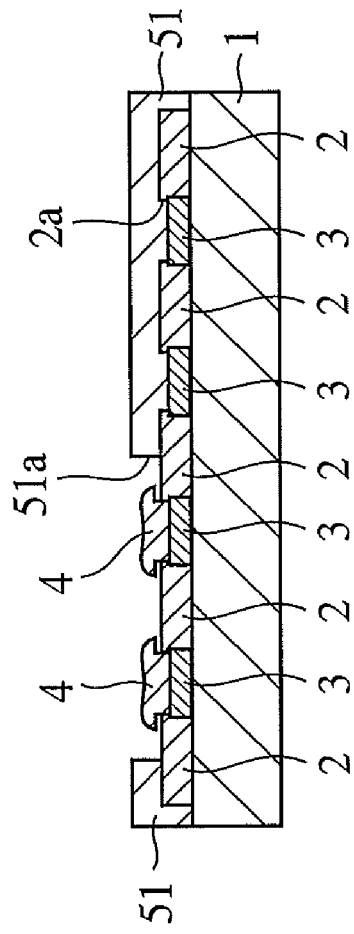
FIG. 11A
FIG. 11B

FIG. 22A
FIG. 22B
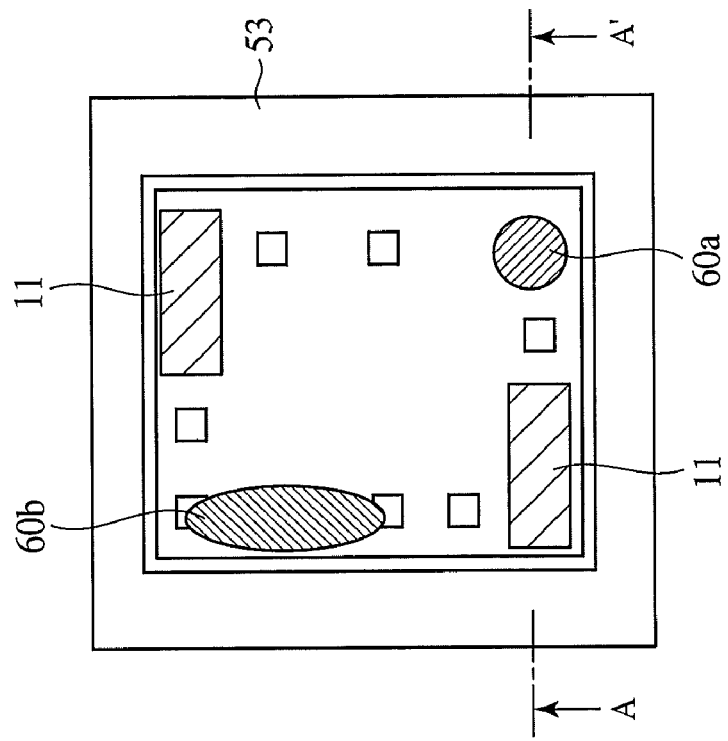
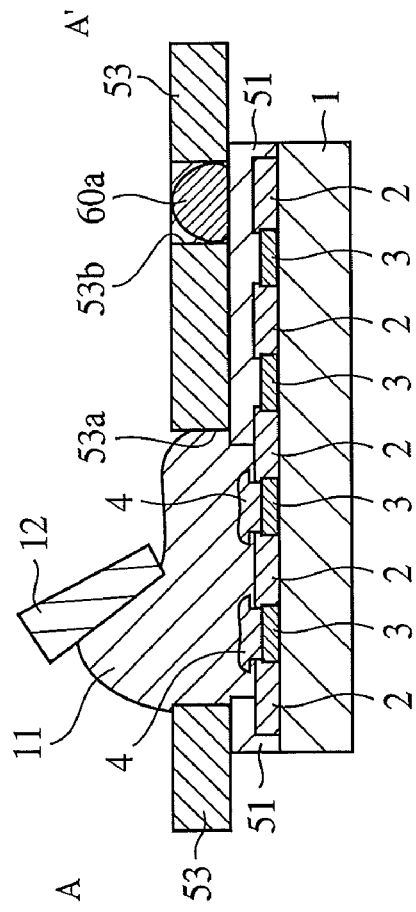

METHOD FOR PROCESSING A BASE THAT INCLUDES CONNECTING A FIRST BASE TO A SECOND BASE WITH AN INSULATING FILM

CROSS REFERENCE TO RELATED APPLICATIONS

This application is a Divisional application of parent application Ser. No. 11/196,487, filed Aug. 4, 2005, now U.S. Pat. No. 7,514,295, which is a continuation-in-part of application Ser. No. 11/017,875, filed Dec. 22, 2004, now abandoned; parent application Ser. No. 11/196,487 further claims the benefit of priority from Japanese Patent Application No. 2004-229921, filed on Aug. 5, 2004, and the prior Japanese Patent Application No. 2005-159364, filed on May 31, 2005. All four of the aforementioned applications are herein incorporated by reference in their entireties.

BACKGROUND OF THE INVENTION

The present invention relates to a joined base comprising a pair of bases (combinations of a semiconductor chip and a circuit board, a semiconductor chip and a semiconductor chip or others) and a method for processing the base (method for fabricating the semiconductor device) which are suitably applicable specifically to the so-called RFID, smart cards, etc.

As the recent electronic apparatuses are more down-sized and thinner, the electronic parts are more required to be mounted in higher densities, and flip-chip mounting, in which electronic parts, such as a semiconductor chip, etc., in bare state are mounted directly on a substrate has been used. On the electrodes of a semiconductor chip used in the flip-chip mounting, bump electrodes are formed to thereby electrically connect the bump electrodes and the interconnections of a circuit board.

The method for forming metal terminals typically include electrolytic plating method, electroless plating method, solder dipping method, solder print transfer method, printing method, etc.

In the electrolytic plating method, a sample is disposed in a plating solution, and while current is supplied to a seed electrode connected to electrode pads, metal terminals are formed at once on the electrode pads patterned in a photo step. A characteristic of the electrolytic plating is that metal terminals of a high aspect ratio can be formed at a several μm~10's μm pitch by using a resist of high resolution. The materials for the metal terminals for the electrolytic plating method are gold, solder, etc.

In the electroless plating method, metal terminals can be formed at once on arbitrary electrode pads. Characteristics of the electroless plating method are that the plating isotropically grows and no photo step is necessary.

In the solder dipping method, a sample having electrode pads is dipped in a molten metal of low melting point containing Sn, Pb or others as the main component and is lifted to thereby cause the low-melting point metal moistened only on the electrode pads due to the surface tension to cool and solidified, and metal terminals are formed.

In the solder print transfer method, a low-melting point metal containing Sn, Pb or others as the main component is pasted and is print applied to recesses formed in a metal plate at electrode pad positions, is reflowed to make the low-melting point metal into spherical electrodes, and the spherical electrodes are transferred to the electrode pads of a sample at once.

In the printing method, by using a fixed mask, not only a metal paste is printed, but also materials mixing organic materials and metal powders, such as conductive silver paste, are used as pad electrodes of low cost.

Furthermore, as techniques for joining the metal terminals of a semiconductor chip and the metal terminals of a circuit board in the flip chip mounting, the following techniques are proposed.

Patent Document 1 discloses the technique that the surface of a semiconductor chip are covered with an adhesive insulating resin, and the insulating resin and the metal terminals are processed by grinding to be a uniform flat surface.

Patent Document 2 discloses the technique that the surface of the semiconductor chip having metal terminals are covered with an insulating resin, the surface of the insulating resin is polished to expose the metal terminals, and then the metal terminals are opposed to each other and joined by thermcompression bonding.

Patent Document 3 discloses the technique that a semiconductor chip and a circuit board are press contacted with each other with a thermosetting resin interposed therebetween, and supersonic vibrations are applied while sustaining the viscosity of the thermosetting resin not to gel the thermosetting resin to thereby form a solid-state diffused layer at the joint between the metal terminals to join the metal terminals to each other.

Patent Document 4 discloses the technique that a semiconductor chip and a circuit board are press contacted with each other with a thermosetting resin interposed therebetween, and the range of sustaining the viscosity of the thermoplastic resin is made narrower than that in Patent Document 2 to form a solid-state diffused layer at the joint between the metal terminals to join the metal terminals to each other.

Patent Document 5 discloses the technique that when a semiconductor chip and a circuit board are joined to each other with a thermoplastic resin interposed therebetween, infrared radiation untransmitting alignment marks are formed at parts of the semiconductor chip except the metal terminals are formed, and the alignment marks are detected by an infrared camera for the alignment.

Patent Document 6 discloses the technique that when a semiconductor chip and a circuit board are joined to each other with a thermosetting resin interposed therebetween, pressure is applied to the metal terminals (conductive patterns) of the circuit board to elastically deform the metal terminals, and the thermosetting resin is set to join the metal terminals to each other with pressurized.

(Patent Document 1) Japanese published unexamined patent application No. Hei 09-237806

(Patent Document 2) Japanese published unexamined patent application No. Hei 11-274241

(Patent Document 3) Japanese published unexamined patent application No. 2001-298146

(Patent Document 4) Japanese published unexamined patent application No. 2003-258034

(Patent Document 5) Japanese published unexamined patent application No. 2002-252245

(Patent Document 6) Japanese published unexamined patent application No. 2001-144141

SUMMARY OF THE INVENTION

In using the above-described conventional techniques to the formation of the metal terminals of electronic parts, LSI, etc. and the step of mounting the electronic parts, the following problems take place.

For example, in the technique disclosed in Patent Document 1 described above, the metal terminals on the surface of a semiconductor chip, and the insulating resin are processed to be a uniform flat surface by grinding. When the object-to-be-ground is a soft material, such as resin, the grinded wastes adhere to the surface of the grinding disc, which causes the problem (burning) of making the grinding impossible. A problem that a resin or a metal which is the base material of the grinding disc contaminates the surface of the resin of the object-to-be-ground is also caused.

In the technique disclosed in Patent Document 2 described above, the metal terminals on the surface of the semiconductor chip, and the insulating resin are processed to be a uniform flat surface by polishing. In the planarization by such polishing, when two or more materials of different hardness are polished, steps called dishing are formed on the polished surface, and the problem that the polished surface is not flat takes place. Problems that water or alcohols used in the polishing deteriorate the resin, and abrasive grains used in the polishing influentially intrude into the surface of the object-to-be-polished take place.

In the technique disclosed in Patent Document 3, a thermosetting resin is applied to a substrate with bumps formed on, and then the solid-state diffused layer is formed on the surfaces of the bumps by supersonic waves to join the metal terminals. Without the planarization by polish or others, the metal terminals are joined to each other. A considerably large load is required to ensure the join, which causes the problem of much damaging the semiconductor chip.

In the techniques of Patent Documents 4 and 6, as in Patent Document 3, considerably large loads are required to ensure the join, and the problem of much damaging the semiconductor chip takes place.

In the technique disclosed in Patent Document 5, the accuracy of the alignment between the semiconductor chip and the circuit board can be improved. Patent Document 5 discloses no special contrivance for the join.

An object of the present invention is to provide a joined base which makes it possible to form at low costs metal terminals which have a uniform height, are flat and smooth and can be connected under a low load, which enables the mounting with low damage, and which highly reliably can prevent the bases from being disjoined for illegal rewriting, and a method for processing the base.

MEANS FOR SOLVING THE PROBLEMS

The method for processing a base according to the present invention comprises the steps of: forming over a surface of a first base a first electrode having a projection and formed of a conductive material which exhibits an adhesiveness at a temperature not lower than a first temperature; covering over the surface of the first base including the first electrode with an insulating film of an insulating material which exhibits an adhesiveness at a temperature not lower than a second temperature; planarizing a surface of the first electrode and a surface of the insulating film by cutting with a cutting tool with the first electrode and the insulating film retained at a temperature lower than a lower one of the first temperature and the second temperature; and raising to a temperature not lower than a higher one of the first temperature and the second temperature, and opposing a second base with a plurality of second electrodes formed on and the first base to each other with the first electrode and the second electrode in contact with each other to connect the first base and the second base by the insulating film while electrically connecting the first electrode and the second electrode with each other.

An Example of this processing method is as follows:

(1) Supplying a conductive material paste to the base 1 to form the bump electrodes (e.g., by printing method);

(2) Semi-curing the conductive material (e.g., for 30 minutes at 80° C.);

(3) Coating with an insulating material;

(4) Semi-curing the insulating material (e.g., for 30 minutes at 110° C.);

(5) Conducting the cutting (e.g., at 50° C.); and (6) Connecting the base 1 and the base 2 to each other (e.g., for 5 seconds at 150° C.).

Another aspect of the method for processing a base according to the present invention comprises the steps of: depositing over a first base an insulating material which exhibits an adhesiveness at a temperature not lower than a second temperature to form an insulating film over a first base; forming an opening in the insulating film; depositing a conductive material which exhibits an adhesiveness at a temperature not lower than a first temperature, filling the opening to form a first electrode; processing a surface of the first electrode and a surface of the insulating film by cutting with a cutting tool to be continuously flat while retaining the first electrode and the insulating film at a temperature lower than a lower one of the first temperature and the second temperature; and raising to a temperature not lower than a higher one of the first temperature and the second temperature, opposing the first base to a second base with a plurality of second electrodes formed on a surface with the first electrode and the second electrode in contact with each other, and connecting the first base and the second base to each other by the insulating film while the first electrode and the second electrode are electrically connected to each other.

An Example of this processing method is as follows:

(1) Depositing an insulating adhesive material (e.g., by spin coating method);

(2) Semi-curing the insulating adhesive material (e.g., for 30 minutes at 110° C.);

(3) Forming an opening in the insulating adhesive material (e.g., by exposure-development);

(4) Burying the conductive material in the opening (e.g., by printing method);

(5) Semi-curing the conductive material (e.g., for 30 minutes at 80° C.);

(6) Conducting the cutting (e.g., at 50° C.); and (7) Connecting the base 1 and the base 2 to each other (e.g., for 5 seconds at 190° C.).

Further another aspect of the method for processing a base according to the present invention comprises the steps of: forming over a surface of a first base a first electrode having a projection and formed of a conductive material which exhibits an adhesiveness at a temperature not lower than a first temperature; forming a first insulating film of a first insulating material which exhibits an adhesiveness at a temperature not lower than a second temperature, covering the surface of the first base in a height smaller than a height of the first electrode; covering over the first insulating film including the first electrode with a second insulating film of a second insulating material which exhibits an adhesiveness at a temperature not lower than a third temperature; processing a surface of the first electrode and a surface of the second insulating film by cutting with a cutting tool to be continuously flat while retaining at a temperature lower than a lowest one of the first temperature, the second temperature and the third temperature; opposing a second base with a second electrode corresponding to the first electrode formed on to the surface of the first base, where the first electrode is formed on; and connecting the first base and the second base to each other and electrically connecting the first electrode and the second electrode to each other by an insulating film of the first insulating film and the second insulating film at a temperature not lower than a highest one of the first temperature, the second temperature and the third temperature.

An Example of this processing method is as follows:

(1) Supplying a conductive material paste to the base 1 to form the bump electrodes (e.g., by printing method).

(2) Semi-curing the conductive material (e.g., for 30 minutes at 80° C.);

(3) Coating with a first insulating material;

(4) Semi-curing the first insulating material (e.g., for 30 minutes at 110° C.);

(5) Coating with a second insulating material;

(6) Semi-curing the second insulating material (e.g., for 30 minutes at 100° C.);

(7) Conducting the cutting (e.g., at 50° C.); and (8) Connecting the base 1 and the base 2 to each other (e.g., for 5 seconds at 150° C.).

Further another aspect of the method for processing a base according to the present invention comprises the steps of: forming a bump electrode on a first base; depositing a conductive material having an adhesiveness on the first base in a region where the bump electrode is formed to form a first electrode of the bump electrode covered with the conductive material; forming on the first base an insulating film of an insulating material having adhesiveness; cutting the surface of the first base with the first electrode and the insulating film formed on to expose the first electrode on the surface while planarizing the surface; opposing a second base having a second electrode corresponding to the first electrode formed on to the surface of the first base and heating the first base and the second base at a temperature at which the conductive material and the insulating material exhibit the adhesiveness to thereby connect the first base and the second base to each other while the first electrode and the second electrode are electrically connected to each other.

Further another aspect of the method for processing a base according to the present invention comprises the steps of: forming over a first base a first magnetic pattern containing a first magnetic material which is not magnetized; forming over a second base a second magnetic pattern containing a second magnetic material which is magnetized; opposing a surface of the first base having the first magnetic pattern formed on and a surface of the second base having the second magnetic pattern formed on to each other, aligning the first base and the second base by a magnetic force exerted between the first magnetic pattern and the second magnetic pattern and connecting the first base and the second base to each other; and thermally processing at a temperature higher than a Curie point of the second magnetic material to unmagnetize the second magnetic material.

EFFECTS OF THE INVENTION

According to the present invention, a joined base which makes it possible to form at low costs metal terminals which have a uniform height, are flat and smooth and can be connected under a low load, which enables the mounting with low damage, and which highly reliably can prevent the bases from being disjoined for illegal rewriting can be realized. Even when the insulator of a first base, such as a semiconductor chip or others is opaque, the electrode surfaces exposed by cutting can be recognized, which facilitates mounting the first base on a second base, such as a circuit board or others in alignment. Bump electrodes are contained in the electrodes for connecting the first base and the second base, whereby the electrodes are kept from begin excessively deformed when the bases are joined, which can precludes an inconvenience of the short-circuit between adjacent electrodes. Magnetic patterns are provided respectively on the first base and on the second base, whereby the first base and the second base can be self-aligned by the magnetic force exerted between the magnetic patterns.

BRIEF DESCRIPTION OF THE DRAWINGS

FIGS. 1A-1G are diagrammatic sectional views showing the method for fabricating a semiconductor device according to a first embodiment of the present invention in the sequence of the fabrication steps.

FIGS. 4A-4F are diagrammatic sectional views showing the method for fabricating a semiconductor device according to a third embodiment of the present invention in the sequence of the fabrication steps.

FIGS. 5A-5G are diagrammatic sectional views showing the method for fabricating a semiconductor device according to a fourth embodiment of the present invention in the sequence of the fabrication steps.

FIGS. 9A and 9B are schematic views showing the method for fabricating an RFID according to the sixth embodiment of the present invention (Part 2).

FIGS. 11A and 11B are schematic views showing the method for fabricating an RFID according to the sixth embodiment of the present invention (Part 4).

FIGS. 22A and 22B are schematic views showing the method for fabricating an RFID according to the seventh embodiment of the present invention (Part 4).

DETAILED DESCRIPTION OF THE PREFERRED EMBODIMENTS

Principle of the Present Invention

Figure 2:
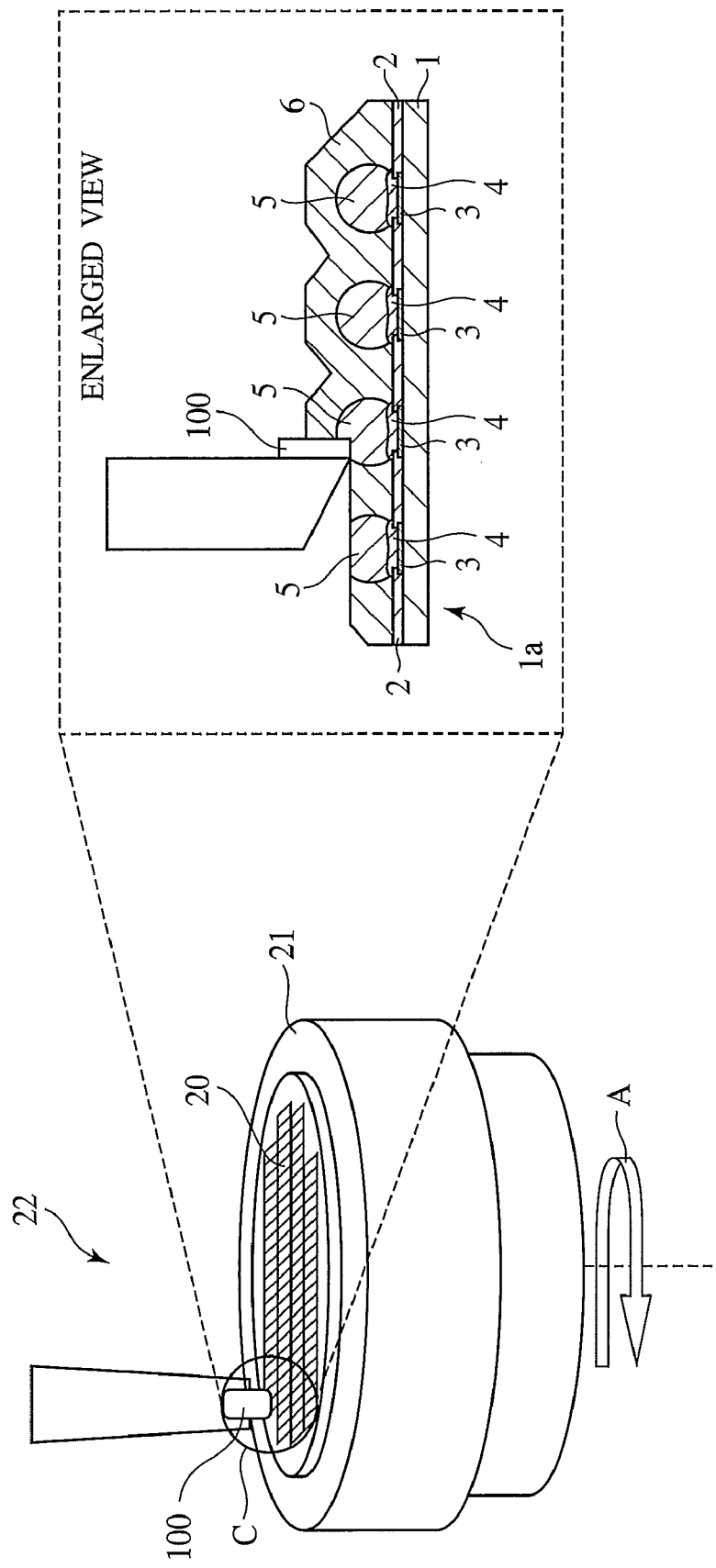
FIG. 2 is a schematic view of one example of the cutting apparatus.

The present invention uses, in place of CMP method, the cutting with a hard cutting tool of diamond or others as the means for planarizing the surfaces of a number of electrodes formed on a base at once, inexpensively and at high speed. With electrodes even buried in an insulating film on the surface of a base, this cutting method can uninterruptedly cut the metal and the insulating film at once on the base, without depending the polishing rates of metal and insulating material, etc., as in the case of CMP method, to thereby generally planarize both uniform without generating dishing, etc.

Diamond, which is superior in heat conductivity, releases outside the frictional heat generated during the cutting to thereby effectively prevent the elution of the insulating material.

Based on this, it is tried to make earnest studies to surely connect bases to each other without increasing the fabrication steps and complication, and to connect the bases to each other by using an adhesive insulating material (underfill, insulating sheet, insulating film or others) as the insulating film burying the electrodes, and planarizing by cutting the surface of, e.g., a first base (the surfaces of the electrodes and the insulating film). That is, the insulating film is used as the seal material for burying and protecting the electrodes and also as the connection reinforcing material for connecting the electrodes of the bases to each other. In this case, the insulating film is not removed after the cutting to utilize the adhesiveness thereof to connect the electrodes, opposed to each other.

In this trial, the insulating material of the insulating film has the property that it exhibits the adhesiveness at not lower than a first temperature and loses the adhesiveness at not lower than a second temperature higher than the first temperature. Specifically, it is solid and does not exhibit the adhesiveness at room temperature, becomes soft and exhibit the adhesiveness at the first temperature, and at the second temperature becomes solid and loses the adhesiveness. The conductive material of the electrodes has the property that it exhibits the adhesiveness at not lower than a third temperature and loses the adhesiveness at not lower than a fourth temperature higher than the third temperature. Specifically, it is solid and does not exhibit the adhesiveness at room temperature, becomes soft and exhibits the adhesiveness at the third temperature and at the fourth temperature becomes solid and loses the adhesiveness.

The planarization by cutting was performed at a temperature lower than a lower value of the first and the second temperature, and the electrodes of a first base (e.g., a discrete semiconductor chip) and the electrodes corresponding thereto of a second base (e.g., a circuit board or a semiconductor chip) were opposed in contact with each other to connect the bases to each other by the insulating material, which exhibits the adhesiveness, while the conductive material (electrodes of the conductive material), which exhibits the adhesiveness of the first base, and the electrodes of the second base are connected to each other.

Then, the insulating material buried between the first base and the electrodes of the second base was cured at a temperature not lower than a higher value of the second temperature and the fourth temperature, while the conductive material connected to the electrodes of the second base was cured. Thus, the rigid connection between the bases, and good electric connection between the electrodes were confirmed. However, a phenomena that when the cutting was performed with a cutting tool, the insulating material had a temperature higher than the first temperature due to the frictional heat by the cutting tool and softened, and films were formed on the surfaces of the similarly softened electrodes was confirmed.

Based on this phenomena, the inventors of the present application has obtained the idea that the temperatures of the insulating film and the electrodes, which are raised by the frictional heat generated in the cutting with a cutting tool are controlled to be lower than temperatures at which the insulating material and the conductive material are softened, i.e., a temperature lower than a lower value of the first temperature and the second temperature to process the conductive material and the insulating material into a continuous plane and to connect to each other.

For example, on the semiconductor chip, when the electrodes of Ag paste, which is softened at 110° C. (the first temperature is 110° C.) and the insulating film of epoxy resin, which is softened at 80° C. (the second temperature is 80° C.) are concurrently cut with a cutting tool to be planarized, the cutting tool is formed of diamond or others, which is superior in heat conduction, and the cutting speed, cutting depth, etc. of the cutting tool are controlled, and the temperature of the insulating film raised by the frictional heat is not higher than 80° C., whereby softening of the Ag paste and the epoxy resin can be suppressed. The Ag paste electrodes are opposed to the electrodes of gold (Au) plating, for example, of a circuit board and pressed under a load of about 10 gf per 1 electrode at a temperature not lower than the second temperature, e.g., 150° C. for a prescribed period of time, whereby the Ag paste electrodes are cured to be brought into close contact with the Au-plated electrodes while the surrounding epoxy resin is cured, and the rigid connection with the epoxy resin and good electric connection between the electrodes can be obtained.

As described above, according to the present invention, in a first substrate, such as a semiconductor chip, etc., the electrodes of a conductive material of the above-described properties are covered with the insulating film of an insulating material of the above-described properties, and the electrodes and the insulating film are cut flush with each other, whereby when the first base is joined to the second base, such as a circuit board, etc., the insulating material can play the role of the mechanical adhesion, and the conductive material can play the role of the electric connection. Thus, this permits the joined base to be fabricated with inexpensive materials and a method which have been unusable.

In the present invention, based on the reflectivity and color tone differences between the electrodes and the insulating film visible on the cut plane of the first base, the positions of LSI on the base surface are recognizable, which allows an insulating material which is opaque to the visible light to be used as the insulating film. Insulating materials which are superior in the adhesion strength and the thermal expansion coefficient of which is controllable are generally opaque.

In consideration of more rigid connection between the first base, such as a semiconductor chip, etc., and the second base, such as a circuit board, etc., and the prevention of rewriting of the contents as of ROM, etc., the inventors of the present application have also obtained the idea that two layers of insulating film are formed of two kinds of insulating materials having the above-described properties. For the convenience of the description, in the following description, the wording "a second temperature", etc., for example, is used but is not related with "a second temperature", etc. used in the above-described case where the single insulating film is formed.

That is, what are used here are a conductive material having the property that it exhibits the adhesiveness at not lower than a first temperature and loses the adhesiveness at not lower than a sixth temperature higher than the first temperature, specifically, it is solid at room temperature and does not exhibit the adhesiveness and becomes soft and exhibits the adhesiveness at the first temperature, and at the sixth temperature, becomes solid and loses the adhesiveness, a first insulating material having the property that it exhibits the adhesiveness at not lower than a second temperature and loses the adhesiveness at not lower than a fourth temperature higher than the second temperature, specifically, it does not exhibit the adhesiveness at room temperature and, at the second temperature, becomes solid and loses the adhesiveness, and a second insulating material having the property that it exhibits the adhesiveness at not lower than a third temperature higher and loses the adhesiveness at not lower than a fifth temperature higher than the third temperature, specifically, it does not exhibit the adhesiveness at room temperature and becomes soft and exhibits the adhesiveness at the third temperature and, at the fifth temperature, becomes solid and loses the adhesiveness. On the first base, the first insulating material is buried between the electrodes lower than the electrodes to form a first insulating film, and the second insulating material is deposited on the first insulating film, covering the electrodes to form a second insulating film. The first insulating film exhibits the high adhesiveness with the first base at not lower than the fourth temperature, and the second insulation material exhibits the adhesion strength with respect to both the first insulation material and the second base at not lower than the fifth temperature.

The thus prepared first substrate is planarized by the cutting with a cutting tool, retained at a temperature of the lowest value of the first temperature, the second temperature and the third temperature, considering the frictional heat as in the above. At this time, planarized surfaces of the electrodes and the second insulating film are exposed on the cut surface. Subsequently, at a temperature not lower than the highest value of the first temperature, the second temperature and the third temperature, the electrodes of the first base and the electrodes corresponding thereto of the second base are opposed and contacted with each other, and the bases are connected by the second insulating material, which exhibits the adhesiveness, while the conductive material (forming the electrodes) of the first base, which exhibits the adhesiveness, and the electrodes of the second base are connected to each other. The second insulating material is superior in adhering the first insulating material and the second base to each other, and the bases are joined more rigid.

Then, at a temperature not lower than the highest value of the fourth temperature, the fifth temperature and the sixth temperature, the first and the second insulating materials buried between the first base and the electrodes of the second base are cured while the conductive material connected to the electrodes of the second base are cured. Thus, the rigid connection between the bases and good electric connection between the electrodes can be obtained. In this case, a material which provides rigid adhesion to the first base can be selected as the first insulating material, which widens the range of the material selection.

Embodiments the Present Invention is Applicable

Embodiments of the present invention will be detailed below with reference to the drawings.

A First Embodiment

The method for fabricating a semiconductor device according to a first embodiment of the present invention will be explained with reference to FIGS. 1 and 2. FIG. 1 is diagrammatic sectional views showing the method for fabricating a semiconductor device according to the first embodiment in the sequence of the steps.

In the present embodiment, a first base is a semiconductor chip discretely cut from a semiconductor wafer and having electrode terminals provided on the primary surface, and a second base is a circuit board with the semiconductor chip flip-chip mounted thereon. The circuit board includes an insulating substrate of glass epoxy or others and a conductive layer formed on the surface and/or inside of the insulating substrate. Electrode terminals corresponding to the electrode terminals of the semiconductor chip to be mounted are provided on the surface.

In the present embodiment, the surface of the semiconductor chip 1a, i.e., the surface-to-be-mounted are planarized by cutting, and then the semiconductor chip and the circuit board are connected to each other with the electrode terminals of the former opposed to the electrode of the latter to each other.

In FIG. 1A, the semiconductor chip 1a comprises a semiconductor substrate 1 of silicon (Si) having over one primary surface a logic circuit and/or a memory circuit (not shown) formed of functional devices, such as MOS transistors, and passive devices, such as capacitors, etc., an insulating layer 2 of silicon oxide, etc., formed on said one primary surface of the semiconductor substrate 1, openings 2a formed selectively in the insulating layer 2, and an electrode layer formed in the openings 2a.

The electrode layer includes a base metal layer of the layer structure of a metal layer 3 of nickel (Ni) formed on aluminum (Al) electrode pads (not shown) led out of the functional element unit and/or the passive element unit, and a metal layer 4 of gold (Au) formed on the metal layer 3. The nickel (Ni) and the gold (Au) are deposited sequentially by electroless plating. The metal layer 3 is formed of a metal such as aluminum (Al), copper (Cu), gold (Au), silver (Ag), nickel (Ni), tungsten (W) or others, or an alloy of them. The metal layer 4 is formed of a metal such as gold (Au), tin (Sn), copper (Cu), silver (Ag), nickel (Ni), tungsten (W) or others, or an alloy of them.

Then, as shown in FIG. 1B, a metal mask 10 is placed on the semiconductor chip 1a so that the surface of the electrode layer is exposed in openings 10a of the metal mask 10.

Subsequently, as shown in FIG. 1C, Ag paste 11 (e.g., trade name: EN4072 from Hitachi Chemical Co., Ltd.) as the conductive material is imprinted in the openings 10a of the metal mask 10 by printing method with a squeegee 12. This Ag paste 11, as a semi-cured state, has the property that, at room temperature, it is solid and does not exhibit the adhesiveness, exhibits the adhesiveness at not lower than a first temperature higher than room temperature, and at not lower than a third temperature higher than the first temperature, it cures. Here, for example, the first temperature is about 80° C., and the third temperature is about 130° C. The conductive material in the present embodiment can be, other than Ag paste, Au paste, Pd paste, Pt paste, their alloy paste or others.

Subsequently, as shown in FIG. 1D, the metal mask 10 is removed, and the Ag paste 11 is semi-cured at about 80~110° C. (so called B-stage cured) to form electrodes 5 which are first electrodes electrically connected to the metal layer 4.

Then, as shown in FIG. 1E, an insulating film 6 of an adhesive insulating material is formed, covering the electrodes 5. This insulating material has the property that it is solid and does not exhibit the adhesiveness at room temperature, exhibit the adhesiveness at not lower than a second temperature higher than room temperature, and cured at not lower than a fourth temperature higher than the second temperature. Here, for example, the second temperature is about 110° C., and the fourth temperature is about 130° C. In the present embodiment, the insulating material is an epoxy resin film-like adhesive and the so-called B-stage adhesive (e.g., trade name: 6200 from Ablestik Company) which is liquid but becomes solid when semi-cured.

The film-like adhesive has the composition of an adhesive component (epoxy resin, phenol resin and an cure accelerator) by 20 wt %, an inorganic filler (silica or alumina filler of a 1.5 μm-average particle diameter and a 10 μm-maximum particle diameter) by 50 wt % and a solvent (ether or ketone) by 25 wt %. The film-like adhesive may contain a plasticizer so as to retain the shape after formed into film. As the plasticizer, polymethyl methacrylate and polyether are best. The quantity of the solvent to be added is not essentially the quantity described in the present embodiment and is controlled depending on kinds of epoxy resin, phenol resin and amine to be used and the thickness of the adhesive to be formed.

The epoxy resin used in the present embodiment can be any as long as it is epoxy resin. However, for higher heat-resistance of the adhesive, preferably, the epoxy resin contains at least two or more functional groups in one molecule. Such epoxy resin is bisphenol A epoxy, bisphenol F epoxy, biphenyl epoxy, bisphenol S epoxy, diphenyl ether epoxy, dicyclopentadiene epoxy, cresol novolac epoxy, DPP novolac epoxy, naphthalene skeleton epoxy or others.

The phenol resin used as the curing agent of the film-like adhesive can be any as long as it is phenol resin. However, when the heat-resistance and ecology are considered, novolac phenol having two or more functional groups is preferable. Such phenol resin is phenol novolac, cresol novolac, naphthol novolac, xylylene novolac, dicyclopentadiene novolac, styrene novolac, allyl novolac or others.

The B-stage adhesive has the composition of an adhesive component (epoxy resin, phenol resin or amine, and a cure accelerator) by 36 wt %, an inorganic filler (silica or alumina filler of a 1.5 μm average particle diameter and a 10 μm-maximum particle diameter) by 10 wt % and a solvent (ether or ketone) by 10 wt %.

Preferably, the phenol resin or amine used as the curing agent of the B-stage adhesive causes the curing reaction on two stages for the B-stage cure. To this end, the phenol resin or amine preferably has steric hindrances. The phenol curing agent is decalin modified phenol novolac or p-hydroxybenzaldehyde phenol novolac. The amine is preferably aromatic amine, e.g., diaminodiphenylmethane, diaminodiphenylsulfone or m-phenylenediamine. Low toxic amine curing agent is the aromatic amine having alkyl groups. The other amine is dicyandiamide or others.

The conductive material and the insulating material used in the present embodiment are exemplified in Table 1.

TABLE 1

| Material | Temperature at which adhesiveness is exhibited | Temperature at which fastening strength is exhibited by curing reaction |
| --- | --- | --- |
| Conductive material (Hitachi Chemical EN4072) | 80° C. (1st temperature) | 130° C. (3rd temperature) |
| Insulating material (Ablestik 6200) | 110° C. (2nd temperature) | 130° C. (4th temperature) |

Subsequently, the cutting is conducted with a hard cutting tool of diamond or others to make the surfaces of the electrodes 5 and the surface of the insulating film 6 of the semiconductor chip 1a continuously flat as shown in FIG. 1F. This planarization of the surfaces makes the height of the respective electrodes 5 uniform.

One example of the cutting apparatus is shown in FIG. 2. In the present embodiment, as shown, a semiconductor wafer having a plurality of semiconductor chips 1a which have not been cut in discrete semiconductor chips 1a has the substrate surface cut at once. It is also possible that discrete semiconductor chips 1a are cut off from the semiconductor wafer having the insulating film 6 formed, covering the electrodes 5 as shown in FIG. 1E, and the discrete semiconductor chips 1a are cut with the cutting apparatus.

The cutting apparatus is the so-called ultra precision lathe, and includes a substrate support table (rotary table) 21 on which the semiconductor wafer 20 (or a discrete semiconductor chip 1a) is mounted fixedly by, e.g., vacuum suction and rotates the semiconductor wafer 20 at a prescribed rotation speed (e.g., about 800 rpm~1600 rpm rotation number) in, e.g., the arrowed direction A in the drawing, and a hard bite 100 which is a cutting tool of diamond or others. The cutting apparatus includes a cutting unit 22 for driving the cutting tool 100 from the periphery of the semiconductor wafer 20 to the center of the rotation. In the cutting, the cutting tool 100 is contacted with the surface of the semiconductor wafer 20, and while the semiconductor wafer 20 is being rotated in the arrowed direction A, the cutting tool 100 is moved from the periphery of the semiconductor wafer 20 to the center of the rotation to cut the semiconductor wafer 20. On the right side of FIG. 2, the cutting of the part in the circle C in the step of FIG. 1E is shown, enlarged. The enlarged view of FIG. 2 is as viewed on the left to the cutting unit 22.

This cutting is an example using an ultraprecision lathe. The cutting can be made with a milling machine.

In the present embodiment, throughout this cutting step, the electrodes 5 and the insulating film 6 are cut while they are kept solid without being softened. That is, the planarization is conducted while the temperature of the semiconductor chips 1a is set at the softening (semi-curing) temperatures of the electrodes 5 and the insulating film 6, i.e., a temperature not higher than 80° C. which is a lower value of the first temperature and the second temperature, e.g., about 50° C., the temperature of the electrodes 5 and the insulating film 6, which is increased by the frictional heat generated in the cutting with the cutting tool 100 is controlled to be lower than 80° C., i.e., while a temperature range which is not higher than 80° C. is retained throughout the cutting step.

Subsequently, from the semiconductor wafer 20, discrete semiconductor chips 1a are cut out. This step is not necessary in the case that discrete semiconductor chips 1a have been cut out before the cutting step. Then, as shown in FIG. 1G, the semiconductor chip 1a, and a circuit board 8 with electrodes 7, second electrodes 7, formed on the surface are aligned with the electrodes 5 of the semiconductor chip 1a and the electrodes 7 of the circuit board 8 opposed to each other. Then, with the temperature of the semiconductor chip 1a and the circuit board 8 set at a temperature higher than the softening temperatures of the electrodes 5 and the insulating film 6, i.e., at not lower than 110° C. of the higher value of the first temperature and the second temperature, and lower than the curing temperature of the electrodes 5 and the insulating film 6, i.e., at lower than 130° C. of the lower value of the third temperature and the fourth temperature, the insulating film 6 is softened with the electrodes 5 and the electrodes 7 opposed to each other and is buried between the electrodes 5 and the electrodes 7 while contacting the electrodes 5 and the electrodes 7 with each other.

Here, the surfaces of the electrodes 5 and the surface of the insulating film 6 have been planarized by the above-described cutting, which allows the electrodes 5 and the insulating film 6 to be discriminated from each other by a prescribed reflectivity measuring apparatus or a camera apparatus, based on reflectivities and color tones of the respective surfaces. The reflectivity difference and the color tone differences may be utilized to align the electrodes 5 and the electrodes 7 with each other.

In this state, the semiconductor chip 1a and the circuit board 8 are pressed against each other at a temperature not lower than a higher value of the third temperature and the fourth temperature, e.g., 130° C.~150° C. under a load of several gfs per one electrode, e.g., 10 gf for a prescribed period of time (e.g., 5 seconds) to cure the conductive material of the electrodes 5 and the insulating material of the insulating film 6. Then they are further set at 150° C. for 30 minutes to completely cure the conductive material and the insulating material. Thus, the semiconductor chips 1a and the circuit board 8 are connected by the insulating film 6 while the electrodes 5, 7 are connected to each other. At this time, while the electrodes 5, 7 are electrically connected to each other, while because of the good adhesiveness of the insulating film 6, the semiconductor chip 1a and the circuit board 8 are surely joined.

At this time, it is also possible that the temperature of the semiconductor chip 1a is set at a temperature lower than 80° C. which is the lower value of the respecting softening temperatures of the electrodes 5 and the insulating film 6, while the temperature of the circuit board 8 is set at a temperature higher than 110° C. which is the higher value of the respective softening temperatures of the electrodes 5 and the insulating film 6, and in this state, with electrodes 5 and the electrodes 7 opposed to each other in contact with each other, the temperatures of the electrodes 5 and the insulating film 6 are raised to not lower than 110° C. to thereby soften the electrodes 5 and the insulating film 6.

Depending on the temperatures and the pressures during the connection, there is a risk that the electrodes 5 may be excessively deformed, or in the worst case, adjacent electrodes 5 may be short-circuited. As a measure for precluding such risk, preferably, the viscosity of the conductive resin forming the electrodes 5 and the viscosity of the insulating resin forming the insulating film 6 are suitably set in accordance with conditions for the connection. For example, the connection is conducted under conditions of 150° C. temperature and a 2 MPa pressure, the viscosities of the conductive resin forming the electrodes 5 and insulating resin are set respectively at, e.g., 1 Mcps and, e.g., 0.1 Mcps so that the viscosity of the conductive resin forming the electrodes 5 is sufficiently higher than the viscosity of the insulating resin forming the insulating film 6, whereby the connection is enabled without excessively deforming the electrodes 5.

Then, solder balls (not shown), for example, etc. for the external connection are provided to the connection terminals (not shown) formed on the other primary surface of the circuit board 8, and the semiconductor device is completed.

As described above, according to the present embodiment, the metal terminals can be formed flat in a uniform height at low costs and under a low load, which enables the mounting without much damage, and semiconductor devices of high reliability can be fabricated.

The planarization with the cutting tool described above has various merits in comparison with the grinding or polishing. The merits will be described below.

In the grinding, a grinding disk having particles (of the micron level) of a high hardness, such as diamond or others, buried in a resin or metal is used. The grinding disc is rotated to grind an object-to-be-ground with the flat surface or the edge of the disc.

In such grinding, waste of an object-to-be-ground attaches to the resin, which is the base material of the grinding disc, and the surface of the grinding disc is made incapable of grinding. Otherwise, a problem of the contamination of the base material with metal ions takes place. The problem that waste of an object-to-be-ground is buried in the surface of the object-to-be-ground takes place.

In the grinding, in which the surface is used for the grinding, the frictional heat causes temperature increase, and the problem that the resin, an object-to-be-ground, may melted can take place. Accordingly, when an object-to-be-ground containing an adhesive resin is ground, the phenomena that the resin melted onto the grinding disc attaches between the diamond particles of the grinding disc, and the grinding cannot be done takes place. The frictional heating can be prevented by feeding water onto the surface of the object-to-be-ground, but the problem that the cooling water degrades the adhesive resin takes place.

In the polishing, abrasives of the micron level are used for the polishing, and the phenomena that the abrasives intrude into the surface of an object-to-be-polished (resin surface or bump surfaces) takes place. Many abrasives easily intrude especially into adhesive resins, the hardnesses of which are low and are soft, which makes it difficult to remove the intruded particles. To completely remove the intruded particles it is necessary that the surface of the object-to-be-polished is solved (together with the abrasives) thin by chemical means, and the water immersed into the resin is dehydrated by heat.

Especially when an object-to-be-polished is formed of a conductive adhesive containing silver (Ag), the water and alcohols used in the polishing causes undesirable influences, such as the water for the polishing causes the oxidation of the silver, in the resin (especially, a resin having adhesiveness).

When materials of two or more different kinds of hardnesses, such as the metal terminals and the insulating resin, are polished, the problem that the polished surface has steps called dishing, and cannot be flat also takes place.

As described above, the planarization by grinding and polishing is not realistic.

The cutting with the cutting tool, in which the planarization is not performed with the surface, has the merit that the above-described problems are not caused. The cut surface as cut with the cutting tool is free from waste of the cutting and clean.

In the present embodiment, the above-described cutting is applied only to one primary surface of a semiconductor chip 1a, but one primary surface of the circuit board 8 is not subjected to the cutting and may have a plurality electrodes made continuously flat to some extent. However, the circuit board 8 may have said one primary surface cut flat, as has the semiconductor chip 1a. In this case, said one primary surface can be cut with a plurality of electrodes 7 alone (without the insulating film covering the electrodes 7) formed on said one primary surface.

A Second Embodiment

The method for fabricating a semiconductor device according to a second embodiment of the present invention will be explained with reference to FIG. 3. FIG. 3 is diagrammatic sectional views showing the method for fabricating a semiconductor device according to the second embodiment in the sequence of the fabrication steps.

The same member of the method for fabricating the semiconductor device according to the first embodiment shown in FIGS. 1 and 2 are represented by the same reference numbers not to repeat or to simplify their explanation. For the convenience of the description, the wording of, e.g., "a second temperature", etc. is used but is not related with "a second temperature" in the first embodiment described above.

In the present embodiment, a first base is a semiconductor chip discretely cut from a semiconductor wafer and having electrode terminals provided on the primary surface, and a second base is a circuit board with the semiconductor chip flip-chip mounted thereon. The circuit board includes an insulating substrate of glass epoxy or others and a conductive layer formed on the surface and/or inside of the insulating substrate. Electrode terminals corresponding to the electrode terminals of the semiconductor chip to be mounted are provided on the surface.

In the present embodiment, the surface of the semiconductor chip 1a, i.e., the surface-to-be-mounted are planarized by cutting, and then the semiconductor chip and the circuit board are connected to each other with the electrode terminals of the former opposed to the electrode of the latter to each other.

Figure 3A:
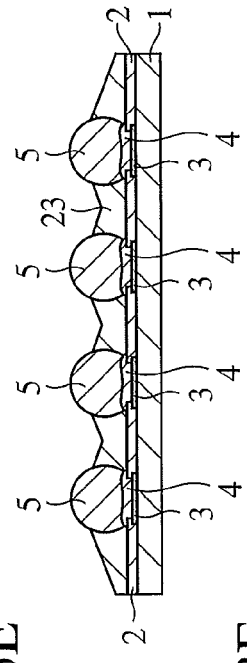
FIGS. 3A-3H are diagrammatic sectional views showing the method for fabricating a semiconductor device according to a second embodiment of the present invention in the sequence of the fabrication steps.

In FIG. 3A, the semiconductor chip 1a comprises a semiconductor substrate 1 of silicon (Si) having over one primary surface a logic circuit and/or a memory circuit (not shown) formed of functional devices, such as MOS transistors, and passive devices, such as capacitors, etc., an insulating layer 2 of silicon oxide, etc., formed on said one primary surface of the semiconductor substrate 1, openings 2a formed selectively in the insulating layer 2, and an electrode layer formed in the openings 2a.

The electrode layer includes a base metal layer of the layer structure of a metal layer 3 of nickel (Ni) formed on aluminum (Al) electrode pads (not shown) led out of the functional element unit and/or the passive element unit, and a metal layer 4 of gold (Au) formed on the metal layer 3. The nickel (Ni) and the gold (Au) are deposited sequentially by electroless plating. The metal layer 3 is formed of a metal such as aluminum (Al), copper (Cu), gold (Au), silver (Ag), nickel (Ni), tungsten (W) or others, or an alloy of them. The metal layer 4 is formed of a metal such as gold (Au), tin (Sn), copper (Cu), silver (Ag), nickel (Ni), tungsten (W) or others, or an alloy of them.

Figure 3B:
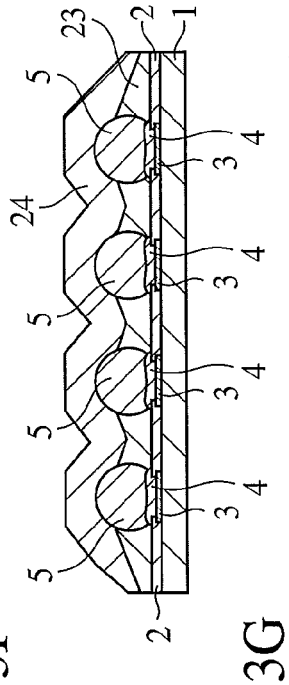

Subsequently, as shown in FIG. 3B, a metal mask 10 is placed with the surface of the metal layer 4 exposed in openings 10a.

Figure 3C:
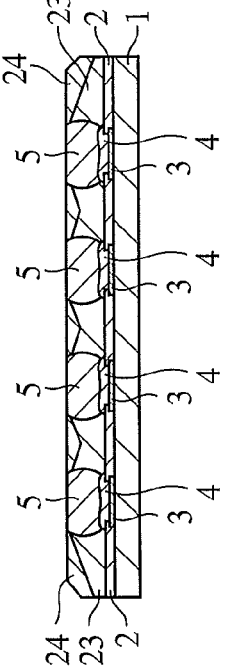

Subsequently, as shown in FIG. 3C, Ag paste 11 (e.g., trade name: EN4072 from Hitachi Chemical Co., Ltd.) as the conductive material is imprinted in the openings 10a of the metal mask 10 by printing method with a squeegee 12. This Ag paste 11, as a semi-cured state, has the property that, at room temperature, it is solid and does not exhibit the adhesiveness, exhibits the adhesiveness at not lower than a first temperature higher than room temperature, and at not lower than a sixth temperature higher than the first temperature, it cures. Here, for example, the first temperature is about 80° C., and the sixth temperature is about 130° C. The conductive material in the present embodiment can be, other than Ag paste, Au paste, Pd paste, Pt paste, their alloy paste or others.

Figure 3D:
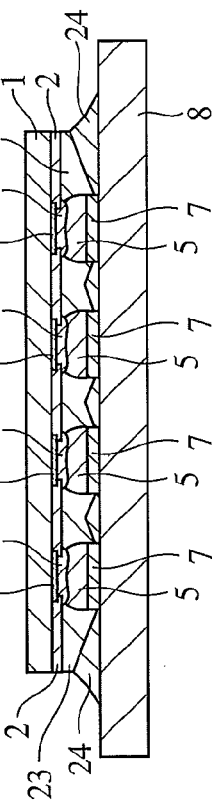

Subsequently, as shown in FIG. 3D, the metal mask 10 is removed, and the Ag paste 11 is semi-cured at about 80~110° C. (so called B-stage cured) to form electrodes 5 which are first electrodes electrically connected to the metal layer 4.

Subsequently, an insulating film of two kinds of adhesive insulating materials (a first and a second insulating materials) is formed covering the electrodes 5.

Figure 3E:
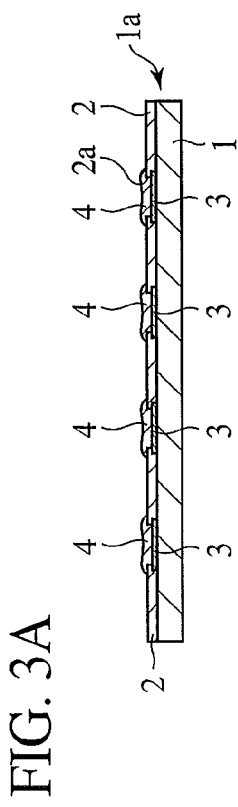
Figure 3F:
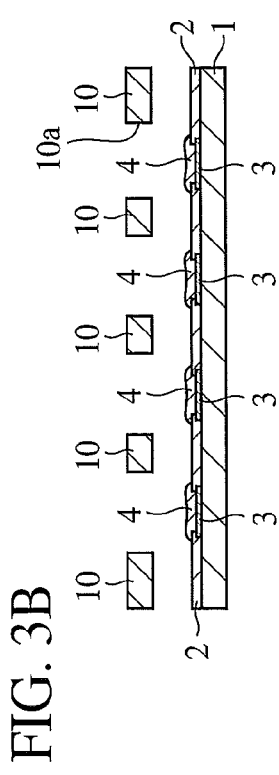

Specifically, first as shown in FIG. 3E, in the semiconductor chip 1a, the first insulating material is buried between the electrodes 5 lower than the height of the electrodes 5 to form a first insulating film 23. Then, as shown in FIG. 3F, the second insulating material is deposited on the first insulating film 23, covering the electrodes 5 to form a second insulating film 24.

The first insulating material has the property that it is solid and does not exhibit the adhesiveness at room temperature, exhibits the adhesiveness at not lower than a second temperature higher than room temperature, and cures at not lower than a fourth temperature higher than the second temperature. Here, for example, the second temperature is about 110° C., and the fourth temperature is about 130° C. The second insulating material has the property that it is solid and does not exhibit the adhesiveness at room temperature, exhibits the adhesiveness at not lower than a third temperature higher than room temperature, and cures at not lower than a fifth temperature higher than the third temperature. Here, for example, the third temperature is about 100° C., and the fifth temperature is about 150° C. The first insulating material exhibits strong adhesion strength with respect to the semiconductor chip 1a at not lower than the fourth temperature, and the second insulating material exhibits strong adhesion strength with respect to both the first insulating material and the circuit board 8 at not lower than the fifth temperature. In the present embodiment, the first insulating material is the epoxy resin film-like adhesive and the B-stage adhesive, and the second insulating material is UF-536 (trade name) from Hitachi Chemical Co., Ltd.

The conductive material and the insulating materials used in the present embodiment are exemplified in Table 2.

TABLE 2

| Material | Temperature at which adhesiveness is exhibited | Temperature at which fastening strength is exhibited by curing reaction |
| --- | --- | --- |
| Conductive material (Hitachi Chemical EN4072) | 80° C. (1st temperature) | 130° C. (6th temperature) |
| 1st insulating material (Ablestik 6200) | 110° C. (2nd temperature) | 130° C. (4th temperature) |
| 2nd insulating material (Hitachi Chemical UF-536) | 100° C. (3rd temperature) | 150° C. (5th temperature) |

Figure 3G:
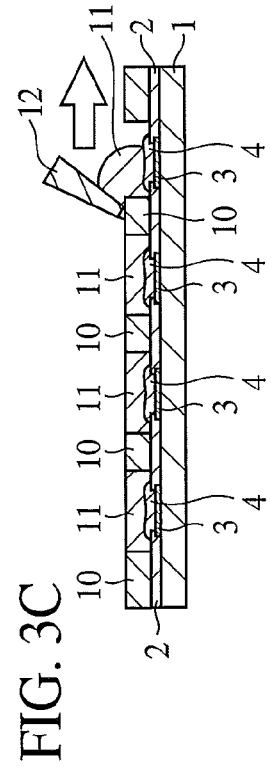

Then, as shown in FIG. 3G, by using the cutting apparatus shown in FIG. 2, the cutting is conducted with the hard cutting tool of diamond or others to make the surfaces of the electrodes 5 and the surface of the second insulating film 24 of the semiconductor chip 1a continuously flat. According to this planarization, the flat surfaces of the electrodes 5 and the flat surface of the second insulating film 24 are exposed on the cut surface. However, when the second insulating film 24 is formed, often some of the first insulating material covers the electrodes 5. In such case, the first insulating material is exposed, surrounding the peripheries of the electrodes 5 on the surface cut by the cutting. However, this first insulating material is exposed in such a smaller amount than the exposed second insulating material that this first insulating material does not influence the adhesiveness. The planarization makes the height of the respective electrodes 5 uniform.

In the present embodiment, throughout this cutting step, the electrodes 5, the first insulating film 23 and the second insulating film 24 are cut while they are kept solid without being softened. That is, the planarization is conducted while the temperature of the semiconductor chips 1a is set at the softening (semi-curing) temperatures of the electrodes 5, the first insulating film 23 and the second insulating film 24, i.e., a temperature not higher than 80° C. which is a lower value of the first temperature, the second temperature and the third temperature, e.g., about 50° C., the temperature of the electrodes 5, the first insulating film 23 and the second insulating film 24, which is increased by the frictional heat generated in the cutting with the cutting tool 100 is controlled to be lower than 80° C., i.e., while a temperature range which is not higher than 80° C. is retained throughout the cutting step.

Figure 3H:
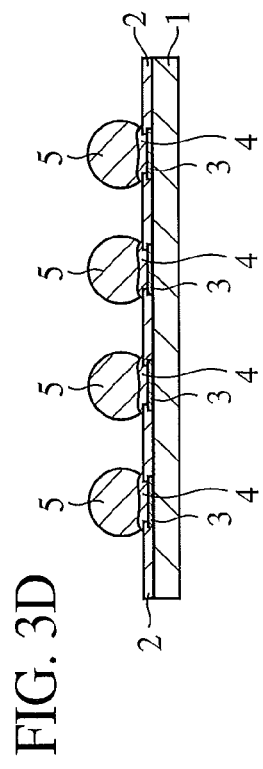

Subsequently, from the semiconductor wafer 20, discrete semiconductor chips 1a are cut out. This step is not necessary in the case that discrete semiconductor chips 1a have been cut out before the cutting step. Then, as shown in FIG. 3H, the semiconductor chip 1a, and a circuit board 8 with electrodes 7, second electrodes 7, formed on the surface are aligned with the electrodes 5 of the semiconductor chip 1a and the electrodes 7 of the circuit board 8 opposed to each other. Then, with the temperatures of the semiconductor chip 1a and the circuit board 8 set at a temperature higher than the softening temperatures of the electrodes 5, the first insulating film 23 and the second insulating film 24, i.e., at not lower than 110° C. of the highest value of the first temperature, the second temperature and the third temperature, and lower than the curing temperature of the electrodes 5 and the insulating film 6, i.e., at lower than 130° C. of the lowest value of the fourth temperature, the fifth temperature and the sixth temperature, the first insulating film 23 and the second insulating film 24 are softened with the electrodes 5 and the electrodes 7 opposed to each other and are buried between the electrodes 5 and the electrodes 7 while contacting the electrodes 5 and the electrodes 7 with each other.

Here, the surfaces of the electrodes 5 and the surface of the second insulating film 24 have been planarized by the above-described cutting, which allows the electrodes 5 and the second insulating film 24 to be discriminated from each other by a prescribed reflectivity measuring apparatus or a camera apparatus, based on reflectivities and color tones of the respective surfaces. The reflectivity difference and the color tone difference may be utilized to align the electrodes 5 and the electrodes 7 with each other.

In this state, the semiconductor chip 1a and the circuit board 8 are pressed against each other at not lower than 150° C. which is a temperature of the highest value of the fourth temperature, the fifth temperature and the sixth temperature under a load of several gfs per one electrode, e.g., 10 gf for a prescribed period of time (e.g., 5 seconds) to cure the conductive material of the electrodes 5 and the respective insulating materials of the first insulating film 23 and the second insulating film 24. Then they are further set at 150° C. for 30 minutes to completely cure the conductive material and the respective insulating materials. Thus, the semiconductor chips 1a and the circuit board 8 are connected by the second insulating film 24 while the electrodes 5, 7 are connected to each other. At this time, while the electrodes 5, 7 are electrically connected to each other, while because of the good adhesiveness of the second insulating film 24, the semiconductor chip 1a and the circuit board 8 are surely joined. The second insulating material is very adhesive to the first insulating material and the circuit board 8, which makes the connection between the semiconductor chip 1a and the circuit substrate 8 further rigid.

At this time, it is also possible that the temperature of the semiconductor chip 1a is set at a temperature lower than 80° C. which is the lowest value of the respecting softening temperatures of the electrodes 5, the first insulating film 23 and the second insulating film 24, while the temperature of the circuit board 8 is set at a temperature higher than 110° C. of the highest value of the respective softening temperatures of the electrodes 5, the first insulating film 23 and the second insulating film 24, and in this state, with electrodes 5 and the electrodes 7 opposed to each other in contact with each other, the temperatures of the electrodes 5 and the second insulating film 24 are raised to not lower than 110° C. to thereby soften the electrodes 5, the first insulating film 23 and the second insulating film 24.

Depending on the temperatures and the pressures during the connection, there is a risk that the electrodes 5 may be excessively deformed, or in the worst case, adjacent electrodes 5 may be short-circuited. As a measure for precluding such risk, preferably, the viscosity of the conductive resin forming the electrodes 5 and the viscosities of the insulating resins forming the insulating films 23, 24 are suitably set in accordance with conditions for the connection. For example, the connection is conducted under conditions of 150° C. temperature and a 2 MPa pressure, the viscosities of the conductive resin forming the electrodes 5 and insulating resin are set respectively at, e.g., 1 Mcps and, e.g., 0.1 Mcps so that the viscosity of the conductive resin forming the electrodes 5 is sufficiently higher than the viscosities of the insulating resins forming the insulating films 23, 24, whereby the connection is enabled without excessively deforming the electrodes 5.

Then, solder balls (not shown), for example, etc. for the external connection are provided to the connection terminals (not shown) formed on the other primary surface of the circuit board 8, and the semiconductor device is completed.

As described above, according to the present embodiment, the metal terminals can be formed flat in a uniform height at low costs and under a low load, which enables the mounting without much damage, and semiconductor devices of high reliability can be fabricated. The use of two kinds of insulating materials (the first and the second insulating materials) makes the connection between the semiconductor chip 1a and the circuit board 8 further rigid and furthermore makes it possible to select as the first insulating material a material of higher adhesiveness with respect to the semiconductor chip 1a. The range of selecting the materials can be larger.

In the present embodiment, the above-described cutting is applied only to one primary surface of a semiconductor chip 1a, but one primary surface of the circuit board 8 is not subjected to the cutting and may have a plurality electrodes made continuously flat to some extent. However, the circuit board 8 may have said one primary surface cut flat, as has the semiconductor chip 1a. In this case, said one primary surface can be cut with a plurality of electrodes 7 alone (without the insulating film covering the electrodes 7) formed on said one primary surface.

A Third Embodiment

The method for fabricating a semiconductor device according to a third embodiment of the present invention will be explained with reference to FIG. 4. FIG. 4 is diagrammatic sectional views showing the method for fabricating a semiconductor device according to the third embodiment in the sequence of the fabrication steps.

The same members of the present embodiment as those of the method for fabricating a semiconductor device according to first and the second embodiments shown in FIGS. 1 to 3 are represented by the same reference numbers not to repeat or to simplify their explanation. For the convenience of the description, in the following description, the wording "a second temperature", for example, is not related with the wording "a second temperature", etc. used in the first and the second embodiments described above.

In the present embodiment, a first base is a semiconductor chip discretely cut from a semiconductor wafer and having electrode terminals provided on the primary surface, and a second base is a circuit board with the semiconductor chip flip-chip mounted thereon. The circuit board includes an insulating substrate of glass epoxy or others and a conductive layer formed on the surface and/or inside of the insulating substrate. Electrode terminals corresponding to the electrode terminals of the semiconductor chip to be mounted are provided on the surface.

In the present embodiment, the surface of the semiconductor chip 1a, i.e., the surface-to-be-mounted are planarized by cutting, and then the semiconductor chip and the circuit board are connected to each other with the electrode terminals of the former opposed to the electrode of the latter to each other.

In FIG. 4A, the semiconductor chip 1a comprises a semiconductor substrate 1 of silicon (Si) having over one primary surface a logic circuit and/or a memory circuit (not shown) formed of functional devices, such as MOS transistors, and passive devices, such as capacitors, etc., an insulating layer 2 of silicon oxide, etc., formed on said one primary surface of the semiconductor substrate 1, openings 2a formed selectively in the insulating layer 2, and an electrode layer formed in the openings 2a.

The electrode layer includes a base metal layer of the layer structure of a metal layer 3 of nickel (Ni) formed on aluminum (Al) electrode pads (not shown) led out of the functional element unit and/or the passive element unit, and a metal layer 4 of gold (Au) formed on the metal layer 3. The nickel (Ni) and the gold (Au) are deposited sequentially by electroless plating. The metal layer 3 is formed of a metal such as aluminum (Al), copper (Cu), gold (Au), silver (Ag), nickel (Ni), tungsten (W) or others, or an alloy of them. The metal layer 4 is formed of a metal such as gold (Au), tin (Sn), copper (Cu), silver (Ag), nickel (Ni), tungsten (W) or others, or an alloy of them.

Subsequently, as shown in FIG. 4B, on the surface of the semiconductor chip 1a, an insulating film 41 formed of an insulating material of a photosensitive insulating adhesive (e.g., trade name: WPR-C200 from JSR Corporation) is formed and is developed by exposing UV rays by photolithography using a photo mask 42. By this photolithography, openings 41a which respectively exposes the metal layer 4 are formed in the insulating film 41. The insulating material has the property that it is solid and does not exhibit the adhesiveness at room temperature, exhibits the adhesiveness at a temperature not lower than a second temperature higher than room temperature, and cures at a temperature not lower than a fourth temperature higher than the second temperature. The insulating material retains cured even at room temperature after cured at not lower than the fourth temperature. Here, for example, the second temperature is about 110° C., and the fourth temperature is about 190° C.

Subsequently, as shown in FIG. 4C, Ag paste 11 (e.g., trade name: EN4072 from Hitachi Chemical Co., Ltd.) as the conductive material is imprinted in the openings 41a of the insulating film 41 by printing method with a squeegee 12. This Ag paste 11, as a semi-cured state, has the property that, at room temperature, it is solid and does not exhibit the adhesiveness, exhibits the adhesiveness at not lower than a first temperature higher than room temperature, and at not lower than a third temperature higher than the first temperature, it cures. Here, for example, the first temperature is about 80° C., and the second temperature is about 130° C. The conductive material in the present embodiment can be, other than Ag paste, Au paste, Pd paste, Pt paste, their alloy paste or others.

The conductive material and the insulating material used in the present embodiment are exemplified in Table 3.

TABLE 3

| Material | Temperature at which adhesiveness is exhibited | Temperature at which fastening strength is exhibited by curing reaction |
| --- | --- | --- |
| Conductive material (Hitachi Chemical EN4072) | 80° C. (1st temperature) | 130° C. (3rd temperature) |
| Photosensitive insulating material (JSR WPR-C200) | 110° C. (2nd temperature) | 190° C. (4th temperature) |

Then, as shown in FIG. 4D, the Ag paste 11 is semi-cured (so called B-stage cured) at about 80° C.~110° C. to form electrodes 5 electrically connected to the metal layer 4 in the opening 41a of the insulating film 41.

Subsequently, as shown in FIG. 4E, by using the cutting apparatus shown in FIG. 2, the surfaces of the electrodes 5 and the surface of the insulating film 41 of the semiconductor chip 1a are cut with a hard cutting tool of diamonds or others to make the surfaces of the electrodes 5 and the surface of the insulating film 41 of the semiconductor chip 1a continuously flat. At this time, this planarization of the surfaces makes the height of the respective electrodes 5 uniform.

In the present embodiment, throughout this cutting step, the electrodes 5 and the insulating film 41 are cut while they are kept solid without being softened. That is, the planarization is conducted while the temperature of the semiconductor chips 1a is set at the softening (semi-curing) temperatures of the electrodes 5 and the insulating film 41, i.e., a temperature not higher than 80° C. which is a lower value of the first temperature and the second temperature, e.g., about 50° C., the temperature of the electrodes 5 and the insulating film 41, which is increased by the frictional heat generated in the cutting with the cutting tool 100 is controlled to be lower than 80° C., i.e., while a temperature range which is not higher than 80° C. is retained throughout the cutting step.

Subsequently, from the semiconductor wafer 20, discrete semiconductor chips 1a are cut out. This step is not necessary in the case that discrete semiconductor chips 1a have been cut out before the cutting step. Then, as shown in FIG. 4F, the semiconductor chip 1a, and a circuit board 8 with electrodes 7, second electrodes 7, formed on the surface are aligned with the electrodes 5 of the semiconductor chip 1a and the electrodes 7 of the circuit board 8 opposed to each other. Then, with the temperature of the semiconductor chip 1a and the circuit board 8 set at a temperature higher than the softening temperatures of the electrodes 5 and the insulating film 41, i.e., at not lower than 110° C. of the higher value of the first temperature and the second temperature, and lower than the curing temperature of the electrodes 5 and the insulating film 6, i.e., at lower than 130° C. of the lower value of the third temperature and the fourth temperature, the insulating film 41 is softened with the electrodes 5 and the electrodes 7 opposed to each other and is buried between the electrodes 5 and the electrodes 7 while contacting the electrodes 5 and the electrodes 7 with each other.

Here, the surfaces of the electrodes 5 and the surface of the insulating film 41 have been planarized by the above-described cutting, which allows the electrodes 5 and the insulating film 41 to be discriminated from each other by a prescribed reflectivity measuring apparatus or a camera apparatus, based on reflectivities and color tones of the respective surfaces. The reflectivity difference and the color tone differences may be utilized to align the electrodes 5 and the electrodes 7 with each other.

In this state, the semiconductor chip 1a and the circuit board 8 are pressed against each other at a temperature not lower than a higher value of the third temperature and the fourth temperature, e.g., 190° C. under a load of several gfs per one electrode, e.g., 10 gf for a prescribed period of time (e.g., 5 seconds) to cure the conductive material of the electrodes 5 and the insulating material of the insulating film 41. Then they are further set at 190° C. for 30 minutes to completely cure the conductive material and the insulating material. Thus, the semiconductor chips 1a and the circuit board 8 are connected by the insulating film 41 while the electrodes 5, 7 are connected to each other. At this time, while the electrodes 5, 7 are electrically connected to each other, while because of the good adhesiveness of the insulating film 41, the semiconductor chip 1a and the circuit board 8 are surely joined.

At this time, it is also possible that the temperature of the semiconductor chip 1a is set at a temperature lower than 80° C. which is the lower value of the respecting softening temperatures of the electrodes 5 and the insulating film 41, while the temperature of the circuit board 8 is set at a temperature higher than 110° C. which is the higher value of the respective softening temperatures of the electrodes 5 and the insulating film 41, and in this state, with electrodes 5 and the electrodes 7 opposed to each other in contact with each other, the temperatures of the electrodes 5 and the insulating film 41 are raised to not lower than 110° C. to thereby soften the electrodes 5 and the insulating film 41.

Depending on the temperatures and the pressures for connecting the semiconductor chip 1a and the circuit board 8, there is a risk that the electrodes 5 may be excessively deformed, or in the worst case, adjacent electrodes 5 may be short-circuited. As a measure for precluding such risk, preferably, the viscosity of the conductive resin forming the electrodes 5 and the viscosity of the insulating resin forming the insulating film 41 are suitably set in accordance with conditions for the connection. For example, the connection is conducted under conditions of 150° C. temperature and a 2 MPa pressure, the viscosities of the conductive resin forming the electrodes 5 and insulating resin are set respectively at, e.g., 1 Mcps and, e.g., 0.1 Mcps so that the viscosity of the conductive resin forming the electrodes 5 is sufficiently higher than the viscosity of the insulating resin forming the insulating film 41, whereby the connection is enabled without excessively deforming the electrodes 5.

Then, solder balls (not shown), for example, etc. for the external connection are provided to the connection terminals (not shown) formed on the other primary surface of the circuit board 8, and the semiconductor device is completed.

As described above, according to the present embodiment, the metal terminals can be formed flat in a uniform height at low costs and under a low load, which enables the mounting without much damage, and semiconductor devices of high reliability can be fabricated. Furthermore, the insulating film 41 functions as the mask for forming the electrodes 5 by printing method and as the insulating adhesive for adhesion fixing the semiconductor chip 1a and the circuit board 8 to each other. Thus, the number of the fabrication steps can be smaller, and semiconductor devices can be easily fabricated.

In the present embodiment, the above-described cutting is applied only to one primary surface of a semiconductor chip 1a, but one primary surface of the circuit board 8 is not subjected to the cutting and may have a plurality electrodes made continuously flat to some extent. However, the circuit board 8 may have said one primary surface cut flat, as has the semiconductor chip 1a. In this case, said one primary surface can be cut with a plurality of electrodes 7 alone (without the insulating film covering the electrodes 7) formed on said one primary surface.

A Fourth Embodiment

The method for fabricating a semiconductor device according to a fourth embodiment of the present invention will be explained with reference to FIG. 5. FIG. 5 is diagrammatic sectional views showing the method for fabricating a semiconductor device according to the fourth embodiment in the sequence of the steps.

The members of the present embodiment as those of the method for fabricating the semiconductor device according to the first to the third embodiments shown in FIGS. 1 to 4 are represented by the same reference numbers not to repeat or to simplify their explanation. For the convenience of the description, the wording "a second temperature", etc., for example, are used but is not related with the "a second temperature" etc. used in the second and the third embodiments.

In the present embodiment, a first base is a semiconductor chip discretely cut from a semiconductor wafer and having electrode terminals provided on the primary surface, and a second base is a circuit board with the semiconductor chip flip-chip mounted thereon. The circuit board includes an insulating substrate of glass epoxy or others and a conductive layer formed on the surface and/or inside of the insulating substrate. Electrode terminals corresponding to the electrode terminals of the semiconductor chip to be mounted are provided on the surface.

In the present embodiment, the surface of the semiconductor chip 1a, i.e., the surface-to-be-mounted are planarized by cutting, and then the semiconductor chip and the circuit board are connected to each other with the electrode terminals of the former opposed to the electrode of the latter to each other.

In FIG. 5A, the semiconductor chip 1a comprises a semiconductor substrate 1 of silicon (Si) having over one primary surface a logic circuit and/or a memory circuit (not shown) formed of functional devices, such as MOS transistors, and passive devices, such as capacitors, etc., an insulating layer 2 of silicon oxide, etc., formed on said one primary surface of the semiconductor substrate 1, openings 2a formed selectively in the insulating layer 2, an electrode layer 3 formed in the openings 2a, and stud bumps 9 of Au or others provided on the electrode layer 3.

The electrode layer 3 is aluminum (Al) pads led out of the functional element unit and/or the passive element unit. As in, e.g., the first to the third embodiments, on the aluminum electrode pads, a base metal layer of the layer structure of a metal layer of, e.g., nickel (Ni) and a metal layer of, e.g., gold (Au) may be provided.

The stud pumps 9 are bump electrodes formed on the aluminum electrode pads by the ball bonding used in the wire bonding technique. That is, the stud pump 9 is formed by forming a ball on the forward end of god wire by discharge, thermo-pressing the ball onto the aluminum electrode pad with capillary for the wire bonding, pulling up the capillary with the wire kept fixed and cutting the wire at the upper end of the ball. The stud bumps 9 must be 1) deformed when the semiconductor chip 1a and the circuit board 8 are adhered to each other, and 2) free from being formed oxide film on the surfaces. In view of them, preferably, the stud bumps 9 are formed of gold or an alloy mainly of gold.

In the first to the third embodiments, the base electrode layer of the Au/Ni layer structure is formed on the aluminum electrode pads, because when the Ag paste 11 is formed directly on the aluminum electrode pads, oxide films are gradually formed on the surfaces of the aluminum electrode pads, and the conduction will be disabled. However, the electroless plating for forming the base electrode layer, in which strong alkaline processing is made, is difficult, depending on LSIs. In RFID, etc., whose electrode number is small, the cost for forming the base electrode layer is high. In this point, in the present embodiment using the stud bumps, such base electrode layer is unnecessary, and the fabrication cost increase by the stud bumps can be suppressed in RFID, etc., whose electrode numbers are relatively small. Thus, the above-described problem of the first to the third embodiments can be solved.

Then, as shown in FIG. 5B, a metal mask 10 having openings 10a is placed on the semiconductor chip 1a with the openings 10a in alignment with regions for the stud bumps 9 to be formed in.

Subsequently, as shown in FIG. 5C, Ag paste 11 (e.g., trade name: EN4072 from Hitachi Chemical Co., Ltd.) as the conductive material is imprinted in the openings 10a of the metal mask 10 by printing method with a squeegee 12. This Ag paste 11, as a semi-cured state, has the property that, at room temperature, it is solid and does not exhibit the adhesiveness, exhibits the adhesiveness at not lower than a first temperature higher than room temperature, and at not lower than a third temperature higher than the first temperature, it cures. Here, for example, the first temperature is about 80° C., and the third temperature is about 130° C. The conductive material in the present embodiment can be, other than Ag paste, Au paste, Pd paste, Pt paste, their alloy paste or others.

Subsequently, as shown in FIG. 5D, the metal mask 10 is removed, and the Ag paste 11 is semi-cured at about 80~110° C. (so called B-stage cured). Thus, the electrodes 5, first electrodes, of the Ag paste 11 are formed, electrically connected to the electrode layer 3 and containing the stud bumps 9 and the stud bumps 9.

Then, as shown in FIG. 5E, an insulating film 6 of an adhesive insulating material is formed, covering the electrodes 5. This insulating material has the property that it is solid and does not exhibit the adhesiveness at room temperature, exhibit the adhesiveness at not lower than a second temperature higher than room temperature, and cured at not lower than a fourth temperature higher than the second temperature. Here, for example, the second temperature is about 110° C., and the fourth temperature is about 130° C. In the present embodiment, the insulating material is an epoxy resin film-like adhesive and the so-called B-stage adhesive (e.g., trade name: 6200 from Ablestik Company) which is liquid but becomes solid when semi-cured. The adhesive insulating material can be that described in the first embodiment.

Then, cutting is conducted with a hard cutting tool of diamond or others to make the surfaces of the electrodes 5 and the surface of the insulating film 6 of the semiconductor chip 1a continuously flat and expose at least the forward ends of the stud bumps 9 as shown in FIG. 5F. This planarization of the surfaces makes the height of the respective electrodes 5 uniform.

In the present embodiment, throughout this cutting step, the electrodes 5 and the insulating film 6 are cut while they are kept solid without being softened. That is, the planarization is conducted while the temperature of the semiconductor chip 1a is set at a temperature lower than the softening (semi-curing) temperatures of the electrodes 5 and the insulating film 6, i.e., a temperature lower than 80° C., which is the lower value of the first temperature and the second temperature, e.g., about 50° C., and temperatures of the electrodes 5 and the insulating film 6 increased by the frictional heat generated in the cutting with the cutting tool 100 are controlled to be lower than 80° C., the planarization is made with the temperature range lower than 80° C. being retained throughout the cutting step.

Subsequently, from the semiconductor wafer 20, discrete semiconductor chips 1a are cut out. This step is not necessary in the case that discrete semiconductor chips 1a have been cut out before the cutting step. Then, as shown in FIG. 5G, the semiconductor chip 1a, and a circuit board 8 with electrodes 7, second electrodes 7, formed on the surface are aligned with the electrodes 5 of the semiconductor chip 1a and the electrodes 7 of the circuit board 8 opposed to each other. Then, with the temperature of the semiconductor chip 1a and the circuit board 8 set at a temperature higher than the softening temperatures of the electrodes 5 and the insulating film 6, i.e., at not lower than 110° C. of the higher value of the first temperature and the second temperature, and lower than the curing temperature of the electrodes 5 and the insulating film 6, i.e., at lower than 130° C. of the lower value of the third temperature and the fourth temperature, the insulating film 6 is softened with the electrodes 5 and the electrodes 7 opposed to each other and is buried between the electrodes 5 and the electrodes 7 while contacting the electrodes 5 and the electrodes 7 with each other.

Here, the surfaces of the electrodes 5 and the surface of the insulating film 6 have been planarized by the above-described cutting, which allows the electrodes 5 and the insulating film 6 to be discriminated from each other by a prescribed reflectivity measuring apparatus or a camera apparatus, based on reflectivities and color tones of the respective surfaces. The reflectivity difference and the color tone differences may be utilized to align the electrodes 5 and the electrodes 7 with each other.

In this state, the semiconductor chip 1a and the circuit board 8 are pressed against each other at a temperature not lower than a higher value of the third temperature and the fourth temperature, e.g., 130° C.~150° C. under a load of several gfs per one electrode, e.g., 10 gf for a prescribed period of time (e.g., 5 seconds) to cure the conductive material of the electrodes 5 and the insulating material of the insulating film 6. Then they are further set at 150° C. for 30 minutes to completely cure the conductive material and the insulating material. Thus, the semiconductor chips 1a and the circuit board 8 are connected by the insulating film 6 while the electrodes 5, 7 are connected to each other. At this time, while the electrodes 5, 7 are electrically connected to each other, while because of the good adhesiveness of the insulating film 6, the semiconductor chip 1a and the circuit board 8 are surely joined.

At this time, it is also possible that the temperature of the semiconductor chip 1a is set at a temperature lower than 80° C. which is the lower value of the respecting softening temperatures of the electrodes 5 and the insulating film 6, while the temperature of the circuit board 8 is set at a temperature higher than 110° C. which is the higher value of the respective softening temperatures of the electrodes 5 and the insulating film 6, and in this state, with electrodes 5 and the electrodes 7 opposed to each other in contact with each other, the temperatures of the electrodes 5 and the insulating film 6 are raised to not lower than 110° C. to thereby soften the electrodes 5 and the insulating film 6.

At this time, in the present embodiment, the stud bumps 9, which are contained inside the electrodes 5, act as the cores of the electrodes 5 to prevent the excessive deformation of the electrodes 5 by the temperature and pressure applied upon the connection. Accordingly, conditions for the connection between the semiconductor chip 1a and the circuit board 8 can be widened, and the range of selecting the material and the process margin can be wider. The stud bumps 9 are formed of a solid metal material which is low resistive and whose resistance value is stable, whereby the connection resistance between the electrodes 5 and the electrodes 7 can be low and stable.

Then, solder balls (not shown), for example, etc. for the external connection are provided to the connection terminals (not shown) formed on the other primary surface of the circuit board 8, and the semiconductor device is completed.

As described above, according to the present embodiment, the metal terminals can be formed flat in a uniform height at low costs and under a low load, which enables the mounting without much damage, and semiconductor devices of high reliability can be fabricated.

The stud bumps, which are contained inside the electrodes, act as the cores of the electrodes to thereby preclude the excessive deformation of the electrodes when the semiconductor chip and the circuit board are connected to each other. This prevents the disadvantages of the short-circuit between the electrodes, etc. The stud bumps are formed of a solid metal material of low resistance and stable low resistance value, which can decrease and stabilize the connection resistance between the semiconductor chip and the circuit substrate. On LSI chips, which are weak to strong alkaline processing, conductive resin bumps can be easily formed by the simple and inexpensive process.

In the present embodiment, the stud bumps 9 are formed inside the electrodes 5 in the method for fabricating the semiconductor device according to the first embodiment, but in the method for fabricating the semiconductor device according to the second or the third embodiment, the stud bumps may be formed inside the electrodes 5. In the third embodiment, the stud bumps 9 can be formed after the insulating film 41 has been formed and before the electrodes 5 are formed.

In the present embodiment, the above-described cutting is applied only to one primary surface of a semiconductor chip 1a, but one primary surface of the circuit board 8 is not subjected to the cutting and may have a plurality electrodes made continuously flat to some extent. However, the circuit board 8 may have said one primary surface cut flat, as has the semiconductor chip 1a. In this case, said one primary surface can be cut with a plurality of electrodes 7 alone (without the insulating film covering the electrodes 7) formed on said one primary surface.

A Fifth Embodiment

The method for fabricating a semiconductor device according to a fifth embodiment of the present invention will be explained with reference to FIGS. 6 and 7. FIGS. 6 and 7 are diagrammatic sectional views showing the method for fabricating the semiconductor device according to the fifth embodiment in the sequence of the steps.

The same members of the present embodiment as those of the method for fabricating the semiconductor device according to the first to the fourth embodiments shown in FIGS. 1 to 4 are represented by the same reference numbers not to repeat or to simplify their explanation. For the convenience of the description, in the following description, the wording, e.g., "a second temperature", etc. is used but is not related with "a second temperature", etc. used in the second and the third embodiments.

In the present embodiment, a first base is a semiconductor chip discretely cut from a semiconductor wafer and having electrode terminals provided on the primary surface, and a second base is a circuit board with the semiconductor chip flip-chip mounted thereon. The circuit board includes an insulating substrate of glass epoxy or others and a conductive layer formed on the surface and/or inside of the insulating substrate. Electrode terminals corresponding to the electrode terminals of the semiconductor chip to be mounted are provided on the surface.

In the present embodiment, the surface of the semiconductor chip 1a, i.e., the surface-to-be-mounted are planarized by cutting, and then the semiconductor chip and the circuit board are connected to each other with the electrode terminals of the former opposed to the electrode of the latter to each other.

Figure 6A:
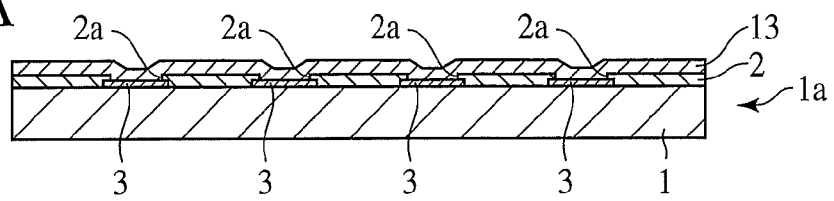
FIGS. 6A-6F are diagrammatic sectional views showing the method for fabricating a semiconductor device according to a fifth embodiment of the present invention in the sequence of the fabrication steps (Part 1).

In FIG. 6A, the semiconductor chip 1a comprises a semiconductor substrate 1 of silicon (Si) having over one primary surface a logic circuit and/or a memory circuit (not shown) formed of functional devices, such as MOS transistors, and passive devices, such as capacitors, etc., an insulating layer 2 of silicon oxide, etc., formed on said one primary surface of the semiconductor substrate 1, openings 2a formed selectively in the insulating layer 2, and an electrode layer 3 formed in the openings 2a. The electrode layer 3 is an aluminum (Al) electrode pad led out of the functional element unit and/or the passive element unit.

A barrier metal 13 is formed over the semiconductor chip 1a by, e.g., plating method. The barrier metal 13 may be formed, e.g., of the layer film of titanium (Ti) and tungsten (W), the layer film of titanium (Ti) and platinum (Pt), the layer film of chrome (Cr) and silver (Ag), the layer film of chrome (Cr) and copper (Cu), the layer film of chrome (Cr) and nickel, or others.

Figure 6B:
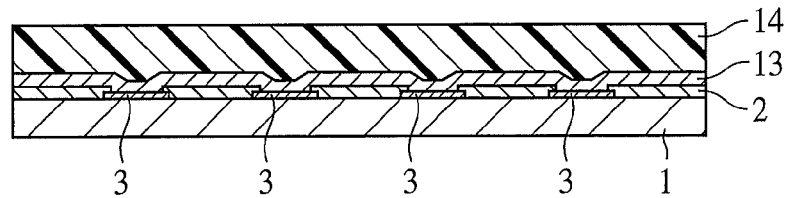

Then, as shown in FIG. 6B, a photoresist film 14 is formed on the barrier metal 13 by, e.g., spin coating method.

Figure 6C:
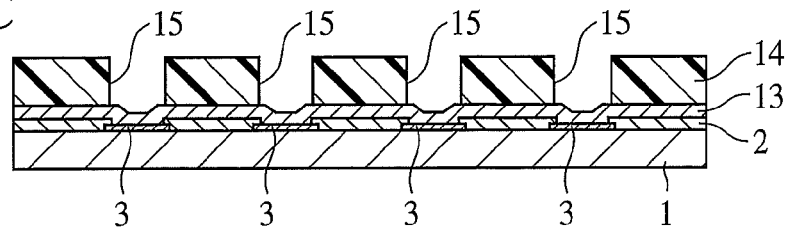

Then, as shown in FIG. 6C, the photoresist film 14 is patterned by photolithography to form openings 15 in the photoresist film 14 at the regions where the electrode layer 3 is formed.

Figure 6D:
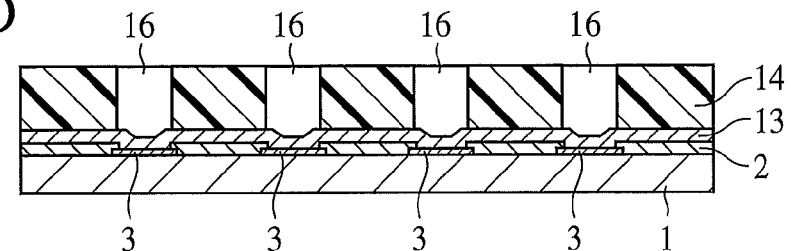

Subsequently, as shown in FIG. 6D, a gold (Au) film is grown selectively on the barrier metal 13 in the opening 15 by, e.g., electrolytic plating method. On the barrier metal 13 in the openings 15, bump electrodes 16 of gold are formed.

The bump electrodes 16 must be 1) deformed when the semiconductor chip 1a and the circuit board 8 are adhered to each other, and 2) free from being formed oxide film on the surfaces. In view of this, preferably, the bump electrodes 16 are formed of gold or an alloy material mainly of gold.

Figure 6E:
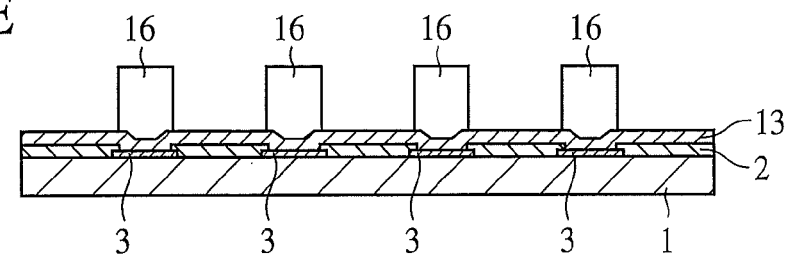

Then, as shown in FIG. 6E, the photoresist film 14 is removed by, e.g., ashing method.

Figure 6F:
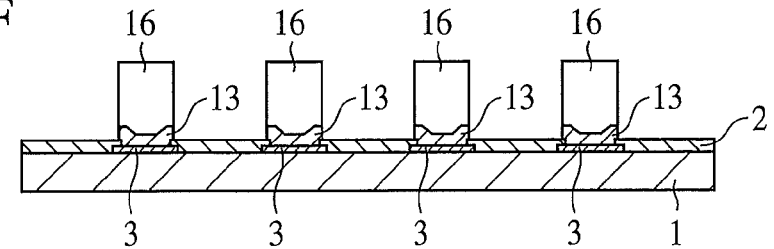
Figure 7A:
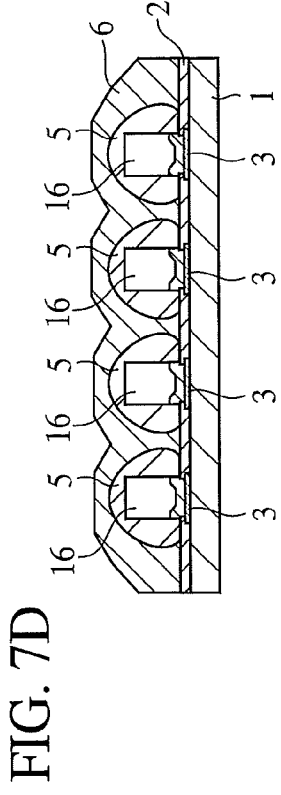
FIGS. 7A-7F are diagrammatic sectional views showing the method for fabricating a semiconductor device according to a fifth embodiment of the present invention in the sequence of the fabrication steps (Part 2).

Then, as shown in FIG. 6F and FIG. 7A, the barrier metal 13 is patterned by, e.g., dry etching with the bump electrodes 16 as the mask to separate the barrier metal 13 between the bump electrodes 16.

In the first to the third embodiments, the base electrode layer of the Au/Ni layer structure is formed on the aluminum electrode pads, because when the Ag paste 11 is formed directly on the aluminum electrode pads, oxide films are gradually formed on the surfaces of the aluminum electrode pads, and the conduction will be disabled. However, the electroless plating for forming the base electrode layer, in which strong alkaline processing is made, is difficult, depending on LSIs. For LSI having a large number of electrodes, the use of stud bumps often increases the fabrication cost. In such case, the use of the bump electrode formed by the electroplating as in the present embodiment can realize the cost reduction.

Figure 7B:
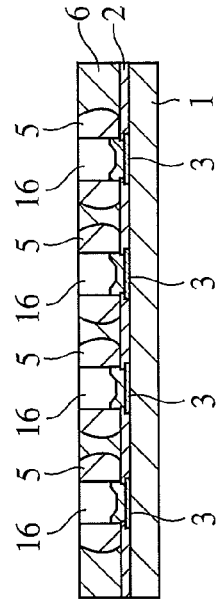
Figure 7C:
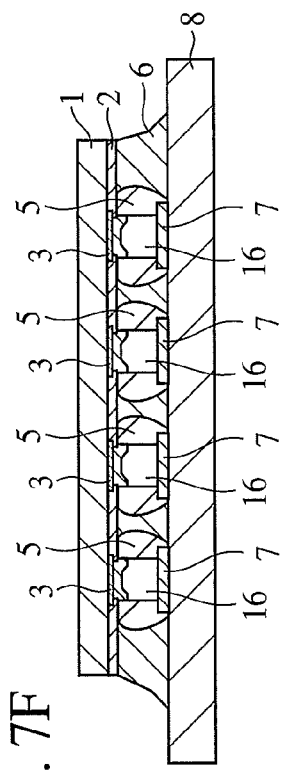

Then, as shown in FIG. 7B, over the semiconductor chip 1a, a metal mask 10 is placed with the openings 10a in alignment with the bump electrodes 16 to expose the bump electrodes 16.

Subsequently, Ag paste 11 (e.g., trade name: EN4072 from Hitachi Chemical Co., Ltd.) as the conductive material is imprinted in the openings 10a of the metal mask 10 by printing method with a squeegee 12. This Ag paste 11, as a semi-cured state, has the property that, at room temperature, it is solid and does not exhibit the adhesiveness, exhibits the adhesiveness at not lower than a first temperature higher than room temperature, and at not lower than a third temperature higher than the first temperature, it cures. Here, for example, the first temperature is about 80° C., and the third temperature is about 130° C. The conductive material in the present embodiment can be, other than Ag paste, Au paste, Pd paste, Pt paste, their alloy paste or others.

Subsequently, as shown in FIG. 1D, the metal mask 10 is removed, and the Ag paste 11 is semi-cured at about 80~110° C. (so called B-stage cured). Thus, the electrodes 5, first electrodes, of the Ag paste 11 are formed, electrically connected to the electrode layer 3 and containing the bump electrodes 16 and the bump electrodes 16.

Figure 7D:
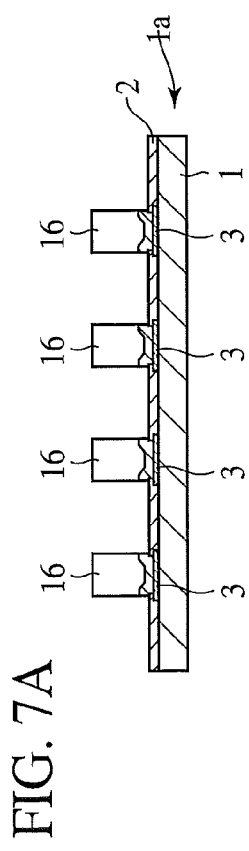

Then, as shown in FIG. 7D, an insulating film 6 of an adhesive insulating material is formed, covering the electrodes 5. This insulating material has the property that it is solid and does not exhibit the adhesiveness at room temperature, exhibit the adhesiveness at not lower than a second temperature higher than room temperature, and cured at not lower than a fourth temperature higher than the second temperature. Here, for example, the second temperature is about 110° C., and the fourth temperature is about 130° C. In the present embodiment, the insulating material is an epoxy resin film-like adhesive and the so-called B-stage adhesive (e.g., trade name: 6200 from Ablestik Company) which is liquid but becomes solid when semi-cured. The adhesive insulating material can be that described in the first embodiment.

Figure 7E:
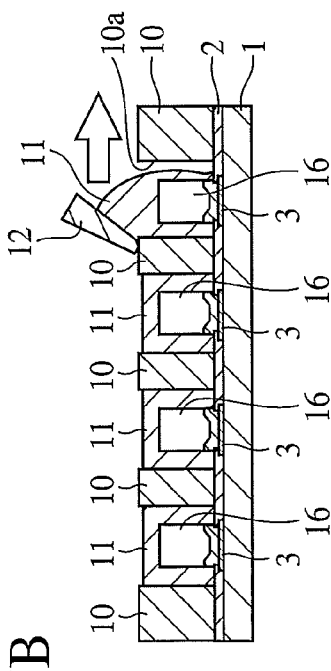
Figure 7F:
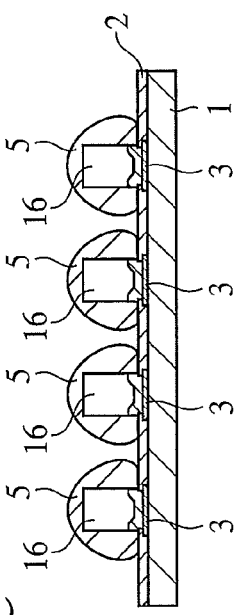

Then, cutting is conducted with a hard cutting tool of diamond or others to make the surfaces of the electrodes 5 and the surface of the insulating film 6 of the semiconductor chip 1a continuously flat and expose the bump electrodes 16 as shown in FIG. 7E. This planarization of the surfaces makes the height of the respective electrodes 5 uniform.

In the present embodiment, throughout this cutting step, the electrodes 5 and the insulating film 6 are cut while they are kept solid without being softened. That is, the planarization is conducted while the temperature of the semiconductor chip 1a is set at a temperature lower than the softening (semi-curing) temperatures of the electrodes 5 and the insulating film 6, i.e., a temperature lower than 80° C., which is the lower value of the first temperature and the second temperature, e.g., about 50° C., and temperatures of the electrodes 5 and the insulating film 6 increased by the frictional heat generated in the cutting with the cutting tool 100 are controlled to be lower than 80° C., the planarization is made with the temperature range lower than 80° C. being retained throughout the cutting step.

Subsequently, from the semiconductor wafer 20, discrete semiconductor chips 1a are cut out. This step is not necessary in the case that discrete semiconductor chips 1a have been cut out before the cutting step. Then, as shown in FIG. 5G, the semiconductor chip 1a, and a circuit board 8 with electrodes 7, second electrodes 7, formed on the surface are aligned with the electrodes 5 of the semiconductor chip 1a and the electrodes 7 of the circuit board 8 opposed to each other. Then, with the temperature of the semiconductor chip 1a and the circuit board 8 set at a temperature higher than the softening temperatures of the electrodes 5 and the insulating film 6, i.e., at not lower than 110° C. of the higher value of the first temperature and the second temperature, and lower than the curing temperature of the electrodes 5 and the insulating film 6, i.e., at lower than 130° C. of the lower value of the third temperature and the fourth temperature, the insulating film 6 is softened with the electrodes 5 and the electrodes 7 opposed to each other and is buried between the electrodes 5 and the electrodes 7 while contacting the electrodes 5 and the electrodes 7 with each other.

Here, the surfaces of the electrodes 5 and the surface of the insulating film 6 have been planarized by the above-described cutting, which allows the electrodes 5 and the insulating film 6 to be discriminated from each other by a prescribed reflectivity measuring apparatus or a camera apparatus, based on reflectivities and color tones of the respective surfaces. The reflectivity difference and the color tone differences may be utilized to align the electrodes 5 and the electrodes 7 with each other.

In this state, the semiconductor chip 1a and the circuit board 8 are pressed against each other at a temperature not lower than a higher value of the third temperature and the fourth temperature, e.g., 130° C.~150° C. under a load of several gfs per one electrode, e.g., 10 gf for a prescribed period of time (e.g., 5 seconds) to cure the conductive material of the electrodes 5 and the insulating material of the insulating film 6. Then they are further set at 150° C. for 30 minutes to completely cure the conductive material and the insulating material. Thus, the semiconductor chips 1a and the circuit board 8 are connected by the insulating film 6 while the electrodes 5, 7 are connected to each other. At this time, while the electrodes 5, 7 are electrically connected to each other, while because of the good adhesiveness of the insulating film 6, the semiconductor chip 1a and the circuit board 8 are surely joined.

At this time, it is also possible that the temperature of the semiconductor chip 1a is set at a temperature lower than 80° C. which is the lower value of the respecting softening temperatures of the electrodes 5 and the insulating film 6, while the temperature of the circuit board 8 is set at a temperature higher than 110° C. which is the higher value of the respective softening temperatures of the electrodes 5 and the insulating film 6, and in this state, with electrodes 5 and the electrodes 7 opposed to each other in contact with each other, the temperatures of the electrodes 5 and the insulating film 6 are raised to not lower than 110° C. to thereby soften the electrodes 5 and the insulating film 6.

At this time, in the present embodiment, the bump electrodes 16, which are contained inside the electrodes 5, act as the cores of the electrodes 5 to prevent the excessive deformation of the electrodes 5 by the temperature and pressure applied upon the connection. Accordingly, conditions for the connection between the semiconductor chip 1a and the circuit board 8 can be widened, and the range of selecting the material and the process margin can be wider. The bump electrodes 16 are formed of a solid metal material which is low resistive and whose resistance value is stable, whereby the connection resistance between the electrodes 5 and the electrodes 7 can be low and stable.

Then, solder balls (not shown), for example, etc. for the external connection are provided to the connection terminals (not shown) formed on the other primary surface of the circuit board 8, and the semiconductor device is completed.

As described above, according to the present embodiment, the metal terminals can be formed flat in a uniform height at low costs and under a low load, which enables the mounting without much damage, and semiconductor devices of high reliability can be fabricated.

The bump electrodes, which are contained inside the electrodes, act as the cores of the electrodes to thereby preclude the excessive deformation of the electrodes when the semiconductor chip and the circuit board are connected to each other. This prevents the disadvantages of the short-circuit between the electrodes, etc. The bump electrodes are formed of a solid metal material of low resistance and stable low resistance value, which can decrease and stabilize the connection resistance between the semiconductor chip and the circuit substrate. On LSI chips, which are weak to strong alkaline processing, conductive resin bumps can be easily formed by the simple and inexpensive process.

In the present embodiment, the bump electrodes 16 are formed inside the electrodes 5 in the method for fabricating the semiconductor device according to the first embodiment, but in the method for fabricating the semiconductor device according to the second or the third embodiment, the bump electrodes may be formed inside the electrodes 5. In the third embodiment, the stud bumps 9 can be formed after the insulating film 41 has been formed and before the electrodes 5 are formed.

In the present embodiment, the above-described cutting is applied only to one primary surface of a semiconductor chip 1a, but one primary surface of the circuit board 8 is not subjected to the cutting and may have a plurality electrodes made continuously flat to some extent. However, the circuit board 8 may have said one primary surface cut flat, as has the semiconductor chip 1a. In this case, said one primary surface can be cut with a plurality of electrodes 7 alone (without the insulating film covering the electrodes 7) formed on said one primary surface.

A Sixth Embodiment

The method for fabricating a semiconductor device according to a sixth embodiment of the present invention will be explained with reference to FIGS. 8 to 18.

In the present embodiment, the present invention is applied to RFID. RFID is the abbreviation for Radio Frequency Identification and is the technology that data are memorized in a wireless chip (RFID tag) of an about several mms~several cms size, and the data contents are read and written by machines via radio waves or others to identify and administer people and things. The present invention is applicable also to forming noncontiguous IC, such as smart cards, etc.

The same members of the method for fabricating a semiconductor device according to the first to the fifth embodiments shown in FIGS. 1 to 7 are represented by the same reference numbers not to repeat or to simplify their explanation. For the convenience of the description, in the following description, the wording "a second temperature", etc., for example, is used but is not related with "a second temperature", etc. used in the first to the fifth embodiments described above.

FIGS. 8 to 18 are schematic views showing the method for fabricating an RFID according to the sixth embodiment in the sequence of the fabrication steps.

In the present embodiment, a semiconductor chip discretely cut from a semiconductor wafer and having electrode terminals provided on the primary surface is a first base, and an RFID antenna unit having an antenna formed on a substrate of polyethylene terephthalate resin (PET resin) or others is a second base. In the present embodiment, the surface of the semiconductor chip, i.e., the surface to-be-mounted, is cut flat, and the electrode terminals of the semiconductor chip and the electrodes of the RFID antenna unit are connected, opposed to each other.

Figures 8A, 8B:
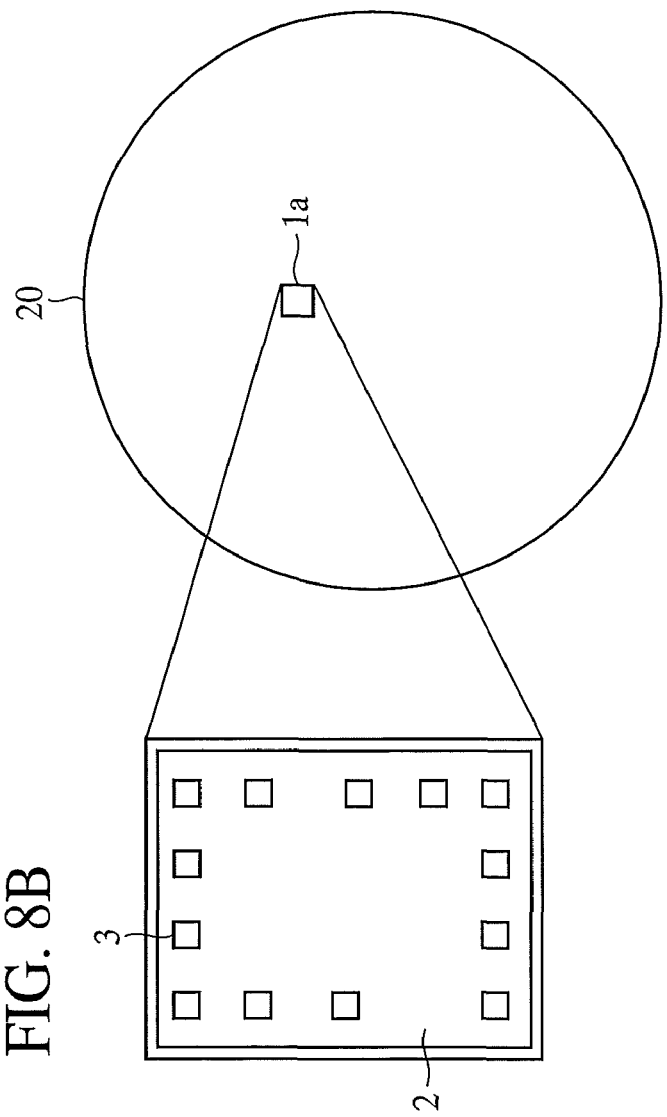
FIGS. 8A and 8B are schematic views showing the method for fabricating an RFID according to a sixth embodiment of the present invention (Part 1).

In FIG. 8, the semiconductor chip 1a comprises a semiconductor substrate 1 of silicon (Si) having over one primary surface a logic circuit and/or a memory circuit (not shown) formed of functional elements, such as MOS transistors, and passive elements, such as capacitors, etc., an insulating layer 2 of silicon oxide formed on said one primary surface of the semiconductor substrate 1, openings 2a formed selectively in the insulating layer 2, and metal layers 3 provided in the openings 2a. The metal layers 3 are formed of a metal such as aluminum (Al), copper (Cu), gold (Au), silver (Ag), nickel (Ni), tungsten (W) or others, or their alloy.

Figure 10A:
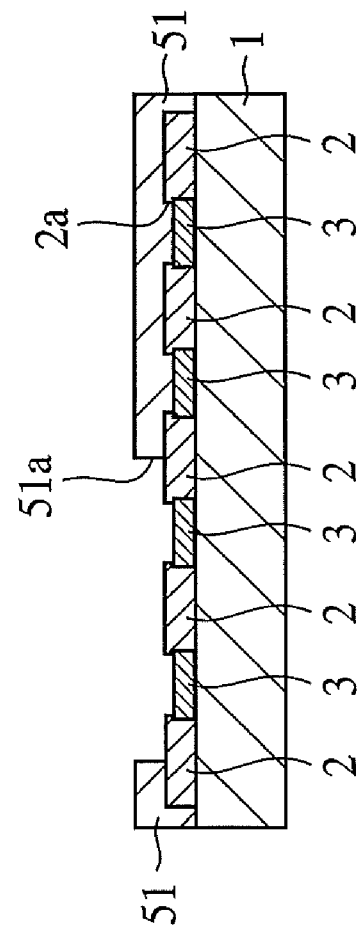
FIGS. 10A and 10B are schematic views showing the method for fabricating an RFID according to the sixth embodiment of the present invention (Part 3).
Figure 10B:
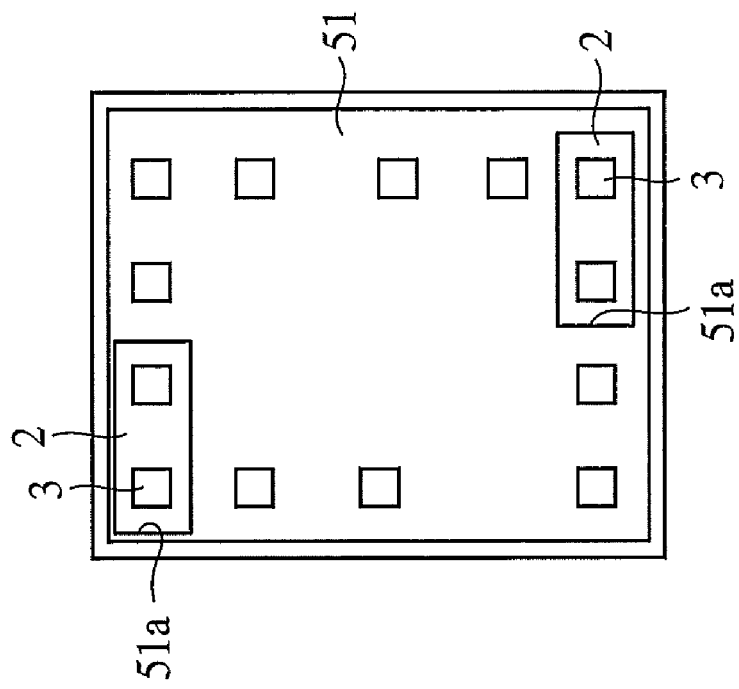

Then, as shown in FIG. 9, a photosensitive resin 51, such as polyimide or others, is applied to the entire surface of the semiconductor chip 1a, covering the metal layers 3. Then, with a photomask 52 having openings 52a formed only in the parts above the prescribed metal layers 3 of the plural metal layers 3, the parts of the photosensitive resin 51 above the prescribed metal layers 3 are exposed. Such photosensitive resin 51 is developed to form the openings 51a exposing the prescribed metal layers 3 in the photosensitive resin 51 as shown in FIG. 10. In the shown example, the openings 51a are formed in the surface of the semiconductor chip 1a at two positions, each exposing two adjacent metal layers 3.

Subsequently, the photosensitive resin 52 is cured, and as shown in FIG. 11, Ni and Au are sequentially deposited by, e.g., electroless plating method to form metal layers 4 on the metal layers 3 exposed in the openings 51a.

Figure 12A:
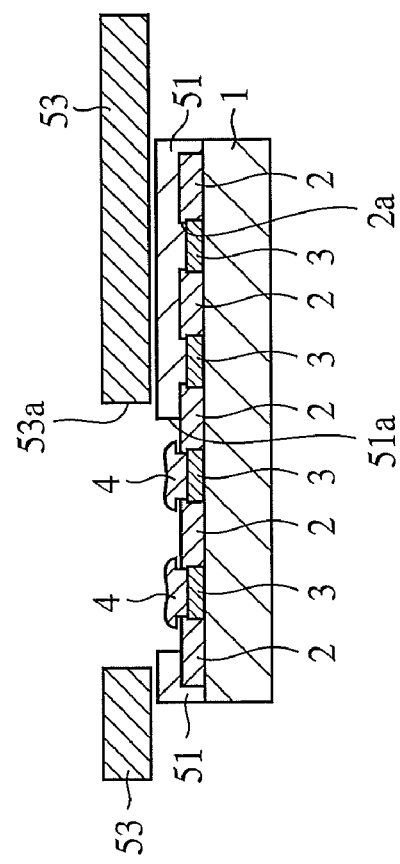
FIGS. 12A and 12B are schematic views showing the method for fabricating an RFID according to the sixth embodiment of the present invention (Part 5).
Figure 12B:
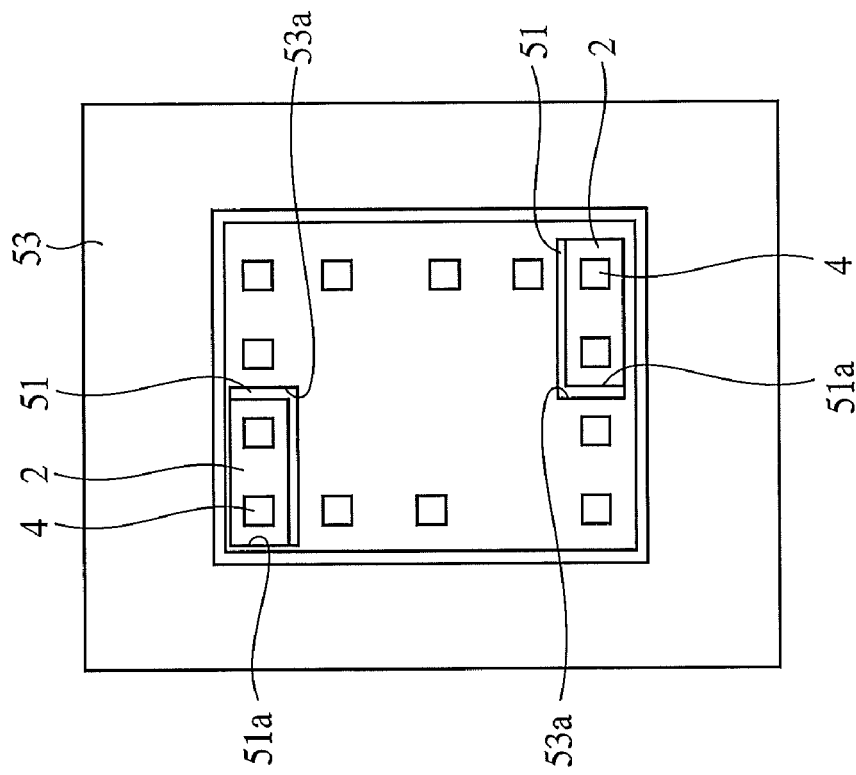

Then, as shown in FIG. 12, a metal mask 53 is placed on the photosensitive resin 51. In the metal mask 53, openings 53a which are larger than the openings 51a are formed in the regions which correspond to the openings 51a of the photosensitive resin 51. The metal mask 53 is aligned with the openings 51a to expose the metal layer 4 in the openings 53a.

Figure 13:
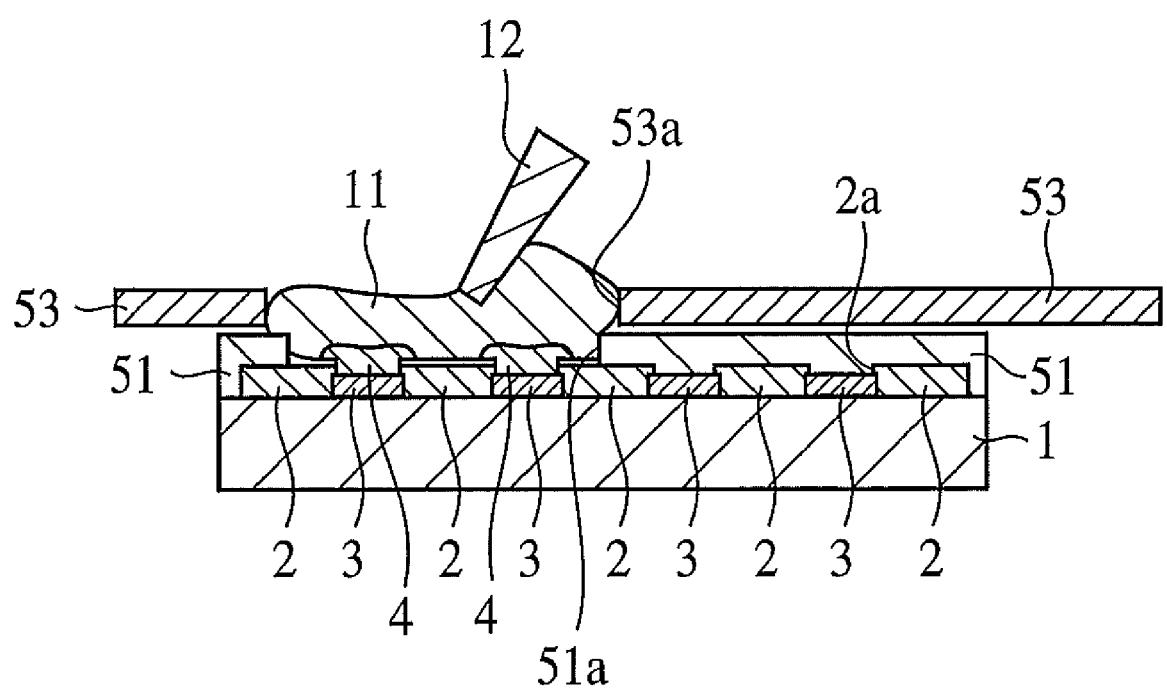
FIG. 13 is schematic views showing the method for fabricating an RFID according to the sixth embodiment of the present invention (Part 6).

Subsequently, as shown in FIG. 13, Ag paste 11 (e.g., trade name: EN4072 from Hitachi Chemical Co., Ltd.) as the conductive material is imprinted, filling the openings 53a of the metal mask 53 by printing method with a squeegee 12. The Ag paste 11 has the property that after semi-cured, it is solid and does not exhibit the adhesiveness at room temperature, exhibit the adhesiveness at not lower than a first temperature higher than room temperature, and cures at not lower than a third temperature higher than the first temperature. Here, for example, the first temperature is about 80° C., and the third temperature is about 130° C. The conductive material in the present embodiment can be, other than the Ag paste, Au paste, Pd paste, Pt paste, their alloy paste or others.

Figure 14B:
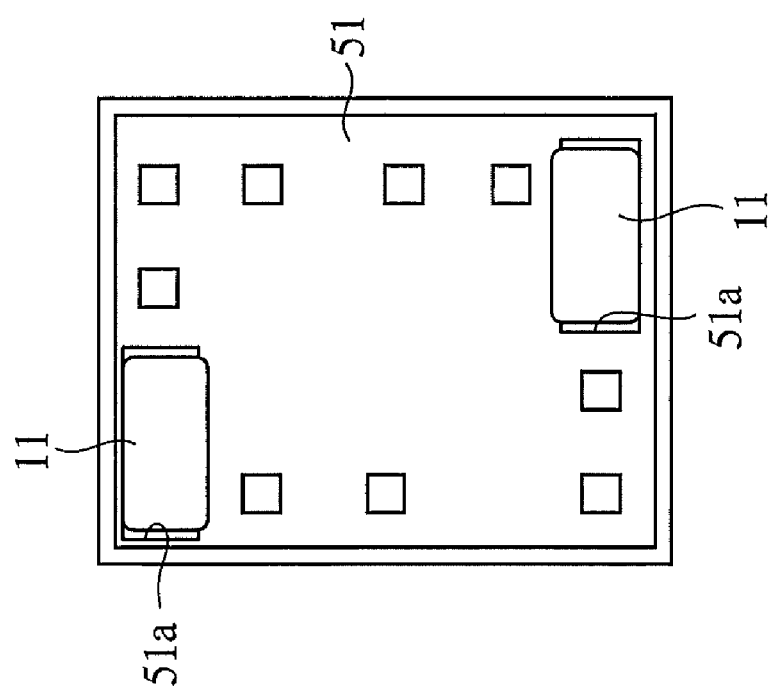
FIGS. 14A and 14B are schematic views showing the method for fabricating an RFID according to the sixth embodiment of the present invention (Part 7).
Figure 14A:
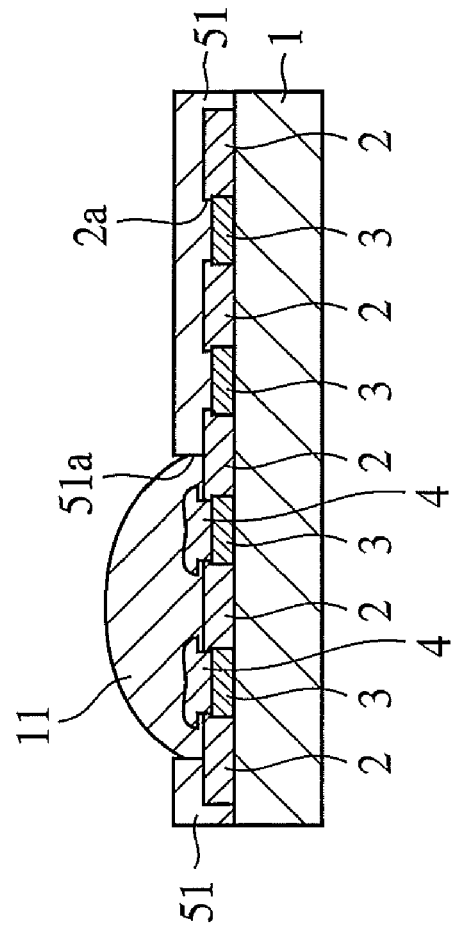

Then, as shown in FIG. 14, the metal mask 52 is removed, and the Ag paste 11 is semi-cured (so called B-stage cured) at about 80° C.~110° C. to form electrodes 5, first electrodes, electrically connected to the metal layer 4 in the openings 51a of the photosensitive resin 51.

Figure 15A:
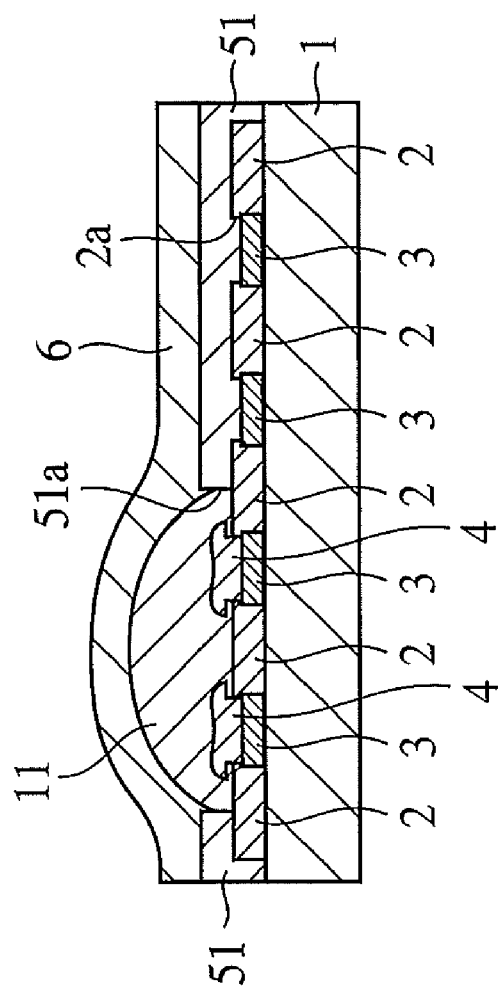
FIGS. 15A and 15B are schematic views showing the method for fabricating an RFID according to the sixth embodiment of the present invention (Part 8).
Figure 15B:
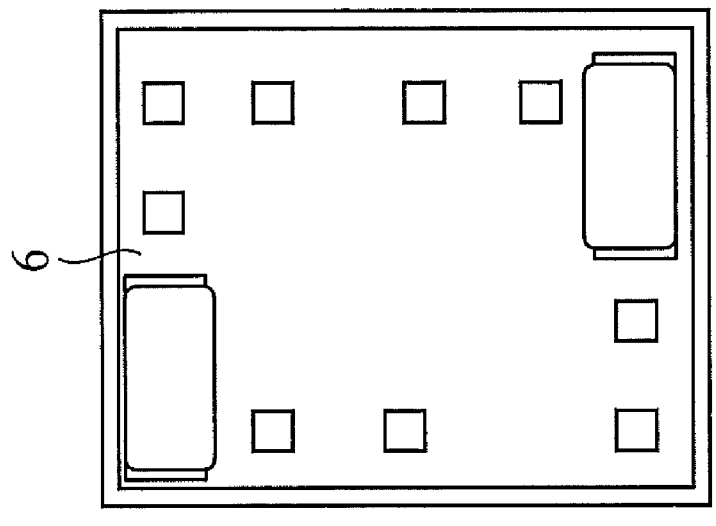
Figure 16B:
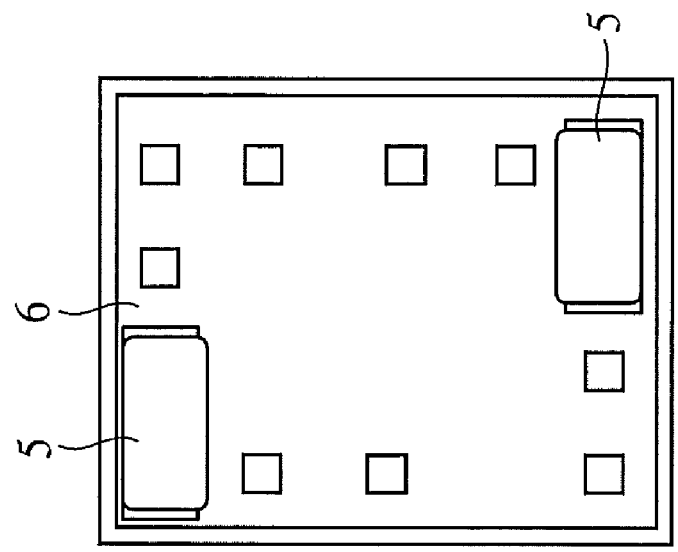
FIGS. 16A and 16B are schematic views showing the method for fabricating an RFID according to the sixth embodiment of the present invention (Part 9).
Figure 16A:
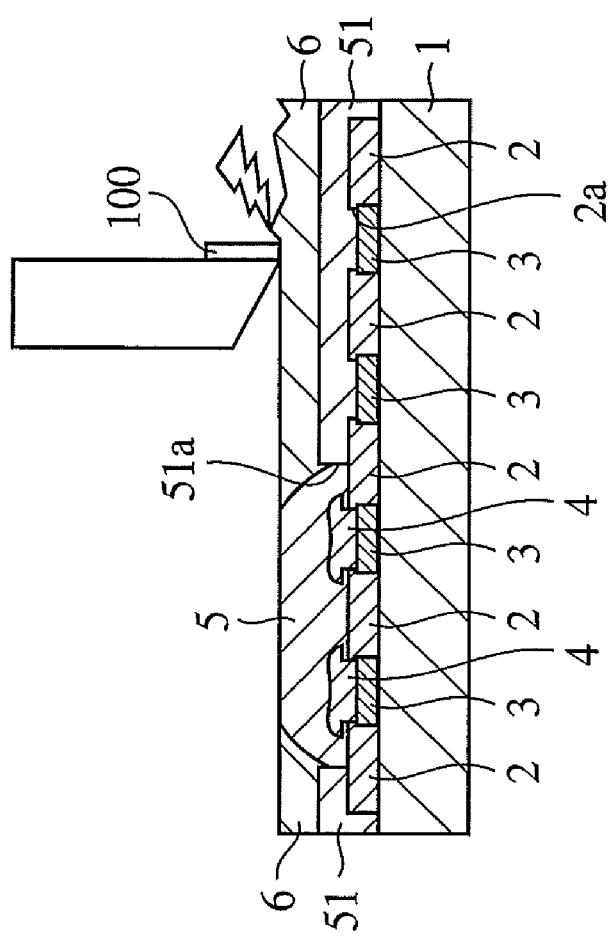

Then, as shown in FIG. 15, an insulating film is formed of an adhesive insulating material, covering the electrodes 5. This insulating material has the property that it is solid and does not exhibit the adhesiveness at room temperature, exhibits the adhesiveness at not lower than a second temperature higher than room temperature, and cures at not smaller than a fourth temperature higher than the second temperature. The insulating material which has cured at not lower than the fourth temperature retains cured-state at room temperature. The second temperature is about 110° C., and the fourth temperature is about 130° C. In the present embodiment, the insulating material is epoxy resin film-like adhesive and a B-stage adhesive as in the first embodiment. Furthermore, the insulating material of the insulating film 6 is opaque to visible light.

Then, cutting is conducted with a hard cutting tool of diamond or others of the cutting apparatus shown in FIG. 2 to make the surfaces of the electrodes 5 and the surface of the insulating film 6 of the semiconductor chip 1a continuously flat. This planarization of the surfaces makes the height of the respective electrodes 5 uniform.

In this cutting step, in the present embodiment, the electrodes 5 and the insulating film 6 are cut while being retained solid throughout the cutting step without being softened. That is, the temperature of the semiconductor chip 1a is set at a temperature lower than 80° C., which is the lower value of the first temperature and the second temperature, e.g., about 50° C., and temperatures of the electrodes 5 and the insulating film 6 increased by the frictional heat generated in the cutting with the cutting tool 100 are controlled to be lower than 80° C., whereby the planarization is made with the temperature range lower than 80° C. being retained throughout the cutting step.

This planarization exposes the cut surfaces of the electrodes 5 enclosed by the insulating film 6 on the surface of the semiconductor chip 1a. At this time, the electrodes 5 and the insulating film 6 can be relatively discriminated from each other by a prescribed reflectivity measuring apparatus or a camera apparatus, based on the reflectivity difference and the color tone differences of the respective surfaces. Accordingly, as described above, this allows an opaque insulating material to be used as the insulating material of the insulating film 6 as described above. The insulating film 6, which is opaque, makes it impossible to look into the inside of the insulating film 6 from the surface of the planarized semiconductor chip 1a, whereby illegal rewriting, etc. of the memorized information, such as rewriting of ROM contents, etc. can be precluded.

Figure 17B:
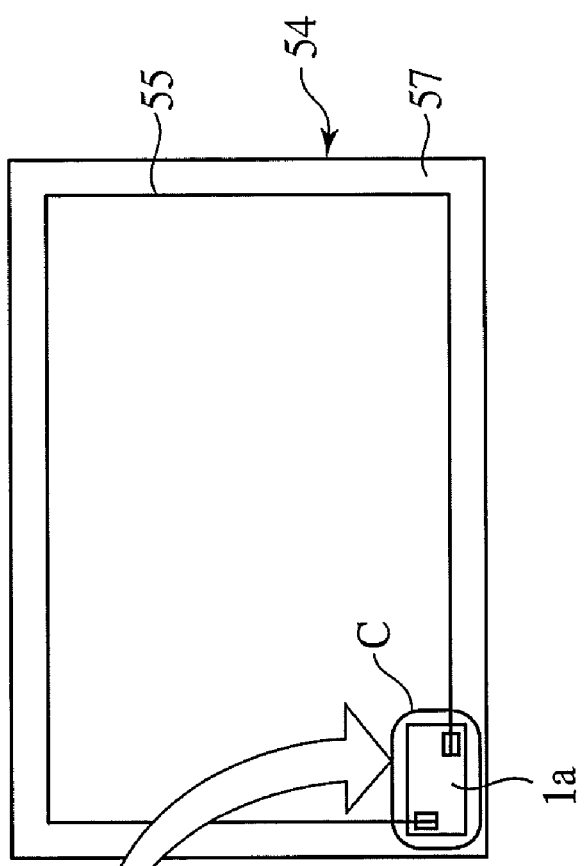
FIGS. 17A and 17B are schematic views showing the method for fabricating an RFID according to the sixth embodiment of the present invention (Part 10).
Figure 17A:
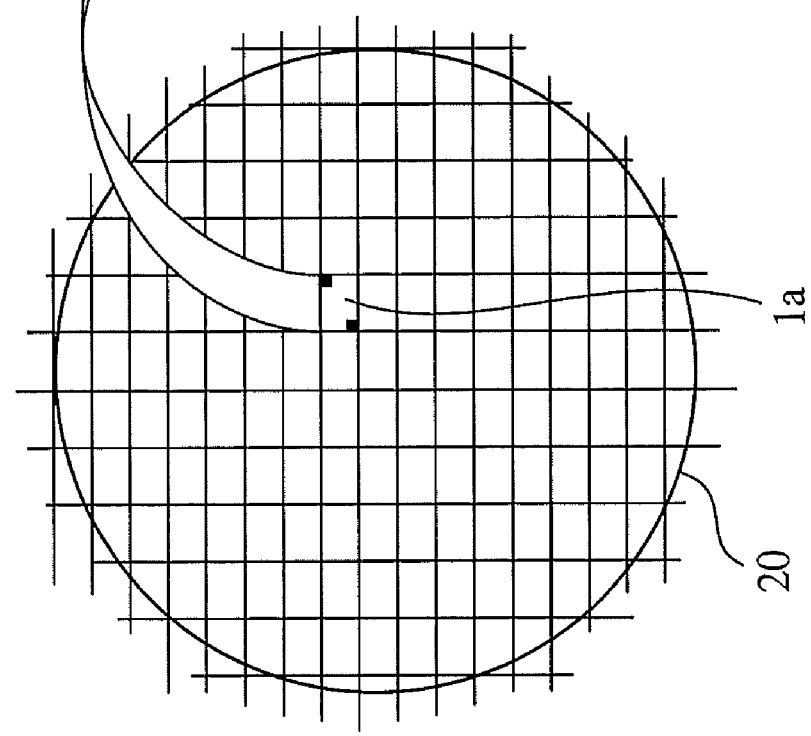
Figure 18A:
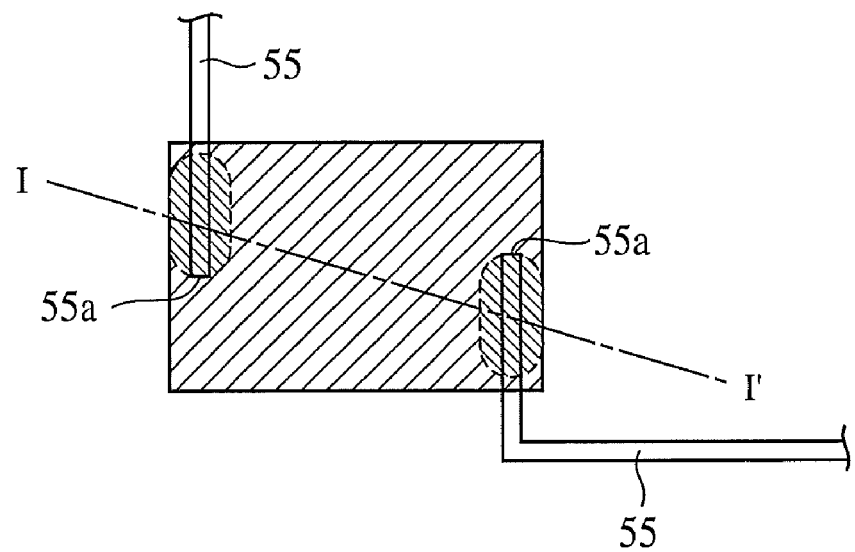
FIGS. 18A and 18B are schematic views showing the method for fabricating an RFID according to the sixth embodiment of the present invention (Part 11).
Figure 18B:
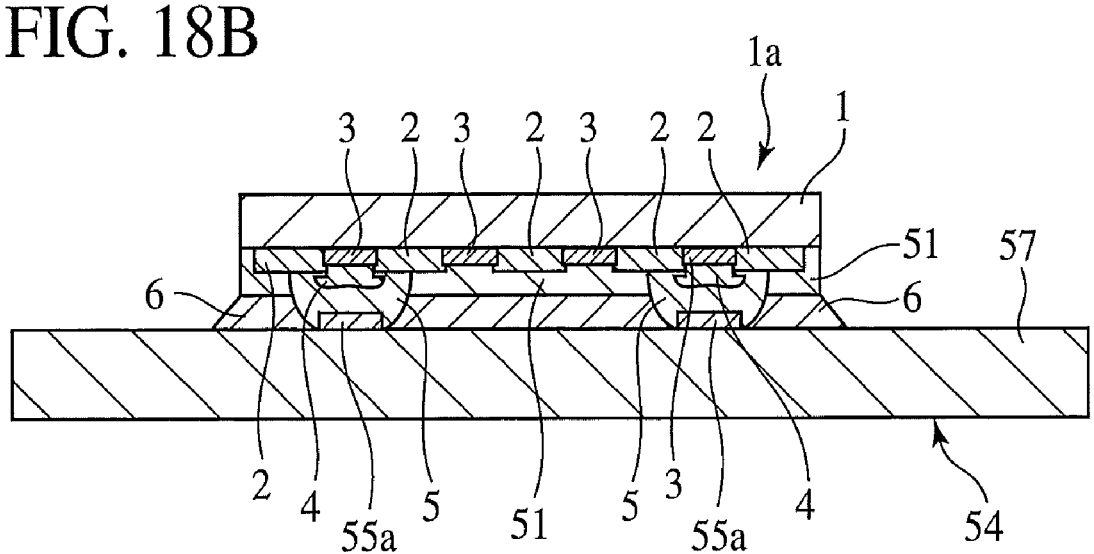

Subsequently, as shown in FIG. 17, from the semiconductor wafer 20, discrete semiconductor chips 1a are cut out. This step is not necessary in the case that discrete semiconductor chips 1a have been cut out before the cutting step. Then, as shown in FIGS. 17 and 18, the semiconductor chip 1a and the RFID antenna unit 54 are connected to each other. The enlarged circled part C in FIG. 17 corresponds to FIG. 18A, and the section along the line I-I' in FIG. 18A corresponds to FIG. 18B. In the RFID antenna unit 54, an antenna 55 is formed on one surface of the base material 57 with coiling, and antenna terminals 55a to be connected to the semiconductor chip 1a are provided on the antenna 55.

The antenna material is copper foil, gold foil, aluminum foil, copper wire, silver wire, gold wire, silver ink, gold ink, palladium ink or others.

When the semiconductor chip 1a and the RFID antenna unit 54 is connected to each other, the electrodes 5 of the semiconductor chip 1a and the antenna terminals 55a of the RFID antenna unit 54 are aligned so as to be opposed them to each other, and the electrodes 5 and the antenna terminals 55a are opposed to each other at temperatures of the semiconductor chip 1a and the RFID antenna unit 54 not lower than a softening temperatures of the electrodes 5 and the insulating film 6, i.e., not lower than 110° C. which is the higher value of the first temperature and the second temperature, and lower than a solidifying (curing) temperatures of the electrodes 5 and the insulating film 6, i.e., lower than 130° C. which is the lower value of the third temperature and the fourth temperature to soften the insulating film 6 to bury the insulating resin of the insulating film 6 between the electrodes 5 and the antenna terminals 55a while the electrodes 5 and the antenna terminals 55a are contacted with each other.

Here, the electrodes 5 and the insulating film 6 are discriminated from each other, based on the reflectivities and color tones of the respective surfaces thereof. Based on the reflectivity and color tone differences, the electrodes 5 and the antenna terminals 55a may be aligned with each other by using the reflectivity measuring apparatus or the camera apparatus.

In this state, the semiconductor chip 1a and the RFID antenna unit 54 are pressed against each other at a temperature not lower than a higher value of the third temperature and the fourth temperature, e.g., 130° C.~150° C. under a load of several gfs per one electrode, e.g., 10 gf for a prescribed period of time to cure the conductive material of the electrodes 5 and the insulating material of the insulating film 6. Then, the semiconductor chip 1a and the RFID 54 are sustained further for about 30 minutes at 150° C. to completely cure the conductive material and the insulating material. Thus, the semiconductor chip 1a and the RFID 54 are connected to each other by the insulating film 6 while the electrodes 5 and the antenna terminals 55a are joined to each other. At this time, while the electrodes 5 and the antenna terminal 55a are electrically connected to each other, while because of the good adhesiveness of the insulating film 6, the semiconductor chip 1a and the RFID antenna unit 54 are surely joined.

At this time, it is also possible that the temperature of the semiconductor chip 1a is set at a temperature lower than 80° C. which is the lower value of the respecting softening temperatures of the electrodes 5 and the insulating film 6, while the temperature of the RFID antenna unit 54 is set at a temperature higher than 110° C. which is the higher value of the respective softening temperatures of the electrodes 5 and the insulating film 6, and in this state, with electrodes 5 and the antenna terminals 55a opposed to each other in contact with each other, the temperatures of the electrodes 5 and the insulating film 6 are raised to not lower than 110° C. to thereby soften the electrodes 5 and the insulating film 6.

Then, following the step of forming a protection film (not shown), etc., the RFID or the noncontiguous IC card is completed.

As described above, according to the present embodiment, the metal terminals the height of which is a uniform height and which are flat can be formed at low costs and under low load, which enable the mounting with low damage, and the RFID or noncontiguous IC card of high reliability can be formed. When the electrodes 5 are formed, openings of an arbitrary size for exposing the arbitrary parts of the metal layers 3 are formed in the photosensitive resin 5, whereby the metal layers 4 can be formed only on the arbitrary parts of the metal layers 3 to thereby form the electrodes 5. This allows necessary parts of the metal layers 3 to be selected to form the electrodes 5, forming no unnecessary electrodes, which makes it possible to efficiently fabricate semiconductor chips.

In the present embodiment, the above-described cutting is applied only to one primary surface of a semiconductor chip 1a, but one primary surface of the RFID antenna unit 54 is not subjected to the cutting and may have antenna terminals 55a made continuously flat to some extent. However, the RFID antenna unit 54 may have said one primary surface cut flat, as has the semiconductor chip 1a.

On the stage of, e.g., the metal layers 3 having been formed on the semiconductor chips 1a, the respective semiconductor chips 1a are tested with test terminals (not shown), and a releasable resin, which prevents the conductive resin adhering to the surface, is applied to those of the semiconductor chips 1a judged defective by the test result so that when the Ag paste 11, which is the material of the electrodes 5, is applied, the conductive resin is not adhered to such semiconductor chips 1a. The defective semiconductor chips 1a may be discriminated from the normal semiconductor chips 1a.

Similarly, on the stage of, e.g., the metal layers 3 having been formed on semiconductor chips 1a, the respective semiconductor chips 1a are tested with test terminals (not shown), and a resin whose color tone is different from the insulating film 6 is dropped to, e.g., the central parts of the surfaces of those of the semiconductor chips 1a judged defected by the test result, whereby the defective semiconductor chips 1a are discriminated from the normal semiconductor chips 1a.

When the insulating film 6 is formed, the indication regions (e.g., fabrication number regions) of a semiconductor wafer 20 for the semiconductor chips 1a are masked with a tape (not shown) of an adhesive material which does not cure at the first temperature. In this state, the insulating film 6 is formed. Then, the tape is removed before a second temperature is applied. Thus, the fabrication number regions are not covered with the insulating resin of the insulating film 6 and suitable functions as the indication regions.

In the present embodiment, the insulating film 6 is formed in a single layer. However, the insulating film may be formed in two layers, as in, e.g., the second embodiment. In this case, the first insulating film and/or the second insulating film is opaque. The electrodes 5 containing cores, as of, e.g., stud bumps, bump electrodes or others, may be formed, as in the fourth or the fifth embodiment.

A Seventh Embodiment

The method for fabricating a semiconductor device according to a seventh embodiment of the present invention will be explained with reference to FIGS. 19 to 26. The same reference numbers of the present embodiment as those the method for fabricating the semiconductor device according to the first to the sixth embodiments shown in FIGS. 1 to 18 are represented by the same reference numbers not to repeat or to simplify their explanation.

When the semiconductor chip 1a and the RFID antenna unit are connected to each other as in the sixth embodiment, the positions of the electrodes on the chip, and the positions of the electrodes on the substrate are respectively recognized, and based on the information of the recognized positions, the alignment is made. For the fabrication of low costs, this string of operations requires the speed of 0.2~0.3 second/piece or more, but it is very difficult to make this string of operations at the speed of 0.5 seconds/piece even with a high-speed apparatus. For example, the 0.2 second/piece speed can be realized if it is possible to pick up 10 semiconductor chips at once, carry the semiconductor chips to the electrodes of the respective RFID antenna units and connecting both to each other in 2 seconds. However, it is difficult in terms of the apparatus to recognize the positions of the respective chips and adjust the positions in alignment with the electrodes of the RFID antenna unit.

The RFID is expected to be used in administrating fabrication steps, transportation steps, retailing steps, etc. and in being attached to articles in markets, department stores, etc. To these ends, the RFID must be about several yens. It is very important to reduce the fabrication cost.

In the present embodiment, the method for fabricating an RFID which facilitates the alignment for connecting a semiconductor chip and an RFID antenna unit to thereby decrease the fabrication cost will be explained. For the convenience of the description, the wording "a second temperature", etc., for example, is used in the following description but is not related with the "a second temperature", etc. in the first to the fifth embodiments described above.

FIGS. 19 to 26 are schematic views showing the method for fabricating an RFID according to the seventh embodiment in the sequence of the fabrication steps.

Here, a semiconductor chip discretely cut from a semiconductor wafer and having electrode terminals provided on the primary surface is a first base, and an RFID antenna unit having an antenna formed on a substrate of polyethylene terephthalate resin (PET resin) or others is a second base. In the present embodiment, the surface of the semiconductor chip, i.e., the surface-to-be-mounted, is cut flat, and the electrodes terminals of the semiconductor chip 1a and the electrodes of the RFID antenna unit are connected, opposed to each other.

First, in the same way as in, e.g., the sixth embodiment shown in FIGS. 8 to 11, a photosensitive resin 51 with openings 51a formed in is formed on a semiconductor chip 1a.

The semiconductor chip 1a comprises a semiconductor substrate 1 of silicon (Si) having over one primary surface a logic circuit and/or a memory circuit (not shown) formed of functional elements, such as MOS transistors, and passive elements, such as capacitors, etc., an insulating layer 2 of silicon oxide formed over said one primary surface of the semiconductor substrate 1, openings 2a formed selectively in the insulating layer 2, and metal layers 3 provided in the openings 2a. The metal layer 3 is formed of a metal such as aluminum (Al), copper (Cu), gold (Au), silver (Ag), nickel (Ni), tungsten (W) or others, or their alloy.

The openings 51a are formed in regions which are above only the prescribed metal layers 3 of the plural metal layers. In the example as shown, the openings 51a are formed in the surface of the semiconductor chip 1a at two parts, respectively exposing adjacent two metal layers 3.

Subsequently, the photosensitive resin 51 is cured, and in the same way as in, e.g., the sixth embodiment shown in FIG. 11, Ni and Au are sequentially deposited by, e.g., electroless plating method to form metal layers 4 on the metal layers 3 exposed in the openings 51a.

Figure 19A:
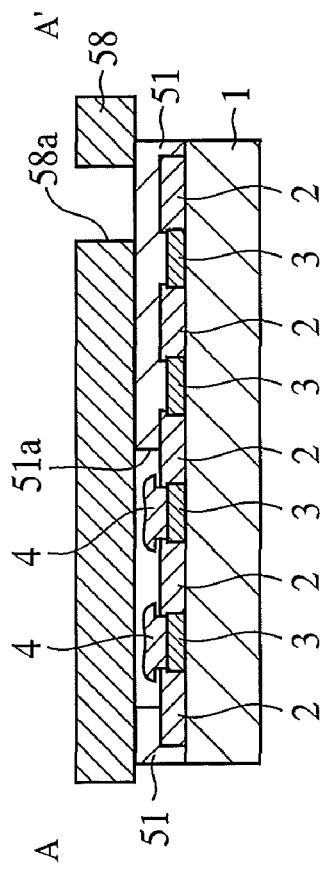
FIGS. 19A and 19B are schematic views showing the method for fabricating an RFID according to a seventh embodiment of the present invention (Part 1).
Figure 19B:
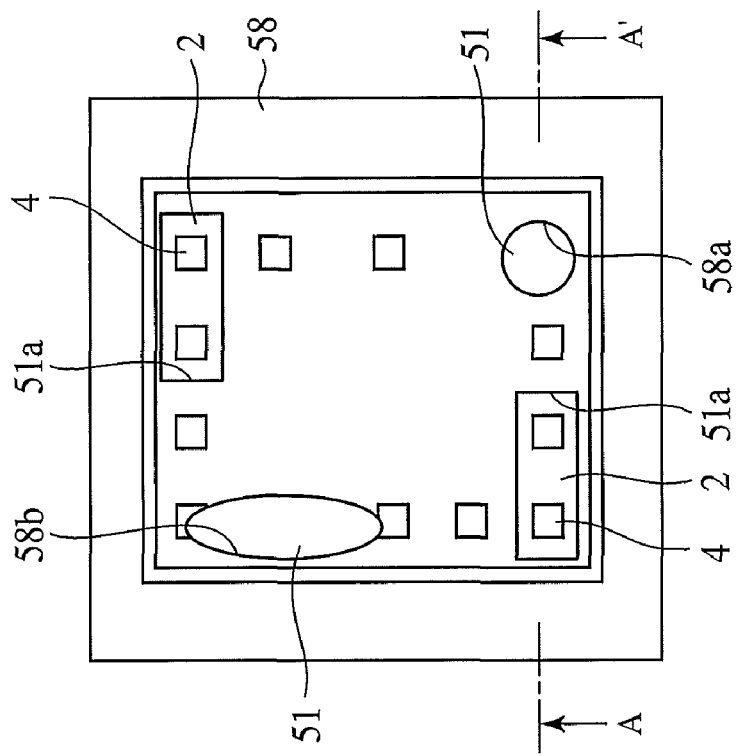

Then, as shown in FIG. 19, a metal mask 58 is placed on the photosensitive resin 51. In the metal mask 58, openings 58a, 58b are formed at parts where the openings 51a of the photosensitive resin 51 are not formed. As exemplified in FIG. 19, the openings 58a, 58b are located at positions on the semiconductor chip 1a which are diagonal to each other and have shapes different from each other.

Figure 20A:
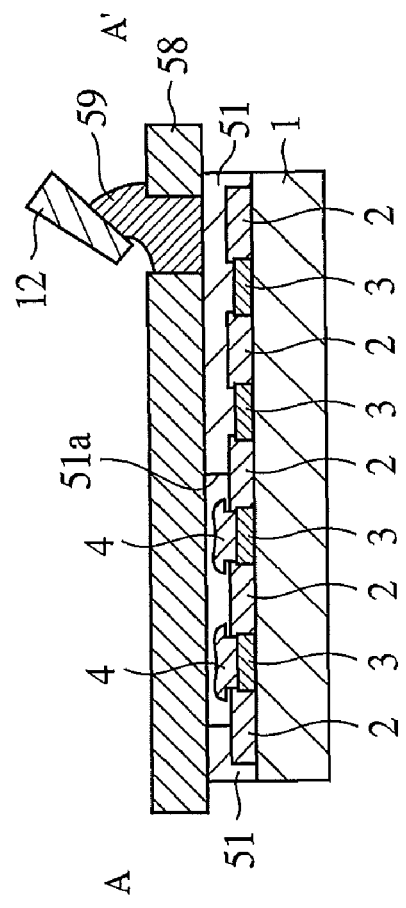
FIGS. 20A and 20B are schematic views showing the method for fabricating an RFID according to the seventh embodiment of the present invention (Part 2).
Figure 20B:
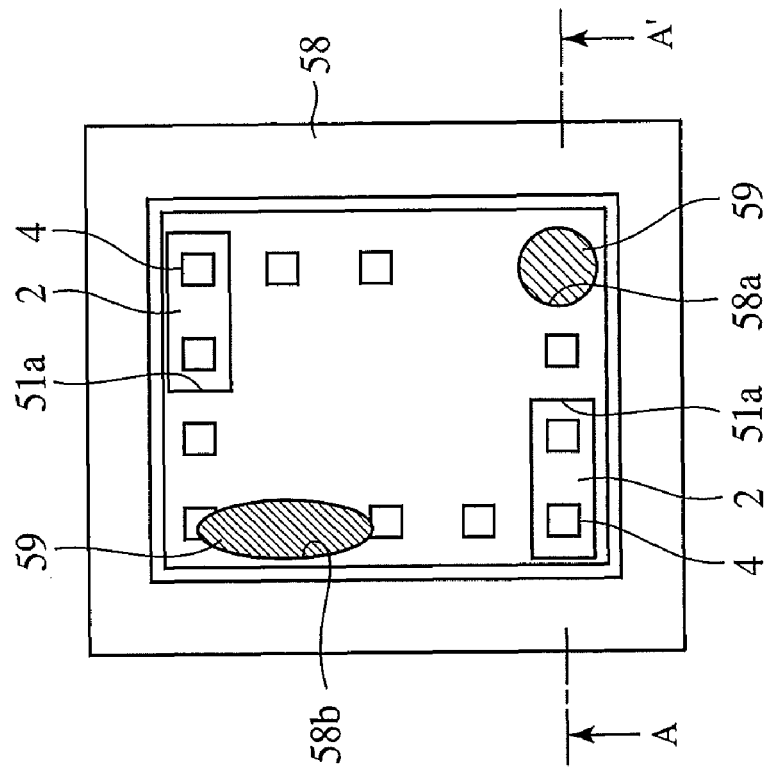

Then, as shown in FIG. 20, magnetic paste 59 is imprinted by printing method with a squeegee 12 to be buried in the openings 58a, 58b. The magnetic paste is a paste of fine particles which are attractable by magnets kneaded in an adhesive resin. The fine particles used in the magnetic paste 59 are a magnetic material whose Curie temperature (Tc), at which the magnetic material loses the magnetism, is below the cure temperature at which the resin is semi-cured, e.g., 100° C. is used. A magnetic material having the Curie point at 100° C. is, e.g., NiZn-based soft ferrite (trade name: XS1) from FDK Corporation.

Figure 21A:
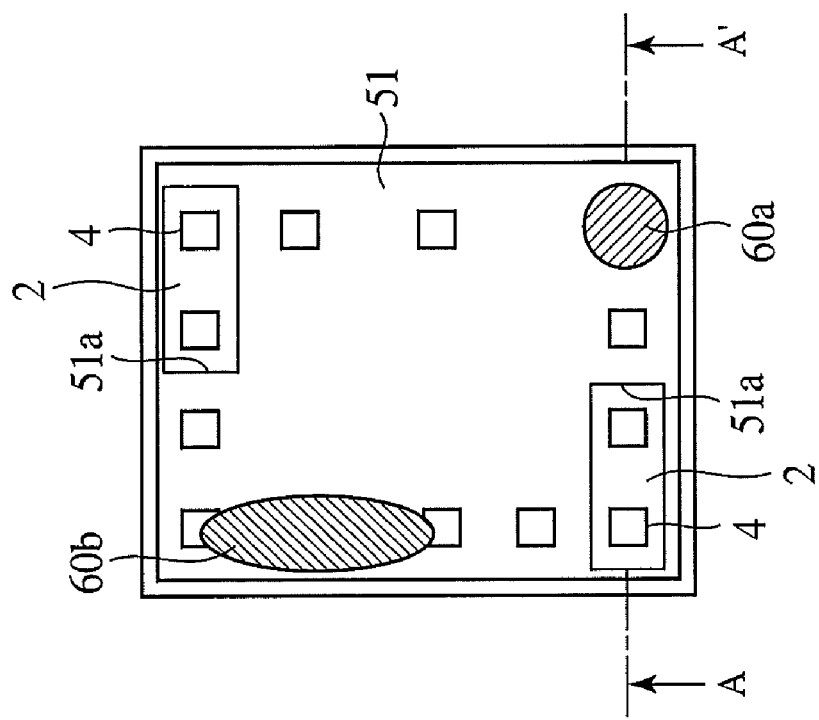
FIGS. 21A and 21B are schematic views showing the method for fabricating an RFID according to the seventh embodiment of the present invention (Part 3).
Figure 21B:
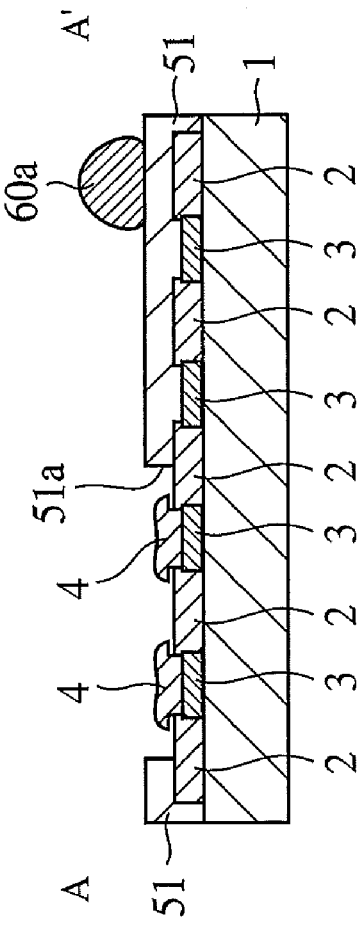

Subsequently, as shown in FIG. 21, the metal mask 58 is removed, and the magnetic paste 59 is semi-cured (so called B-stage cured) at about 80° C.~110° C. to form magnetic patterns 60a, 60b on the photosensitive resin 51. Here, the magnetic pattern 60a is formed of the magnetic paste 59 filled in the opening 58a, and the magnetic pattern 60b is the magnetic paste 59 filled in the opening 58b. The magnetic patterns 60a, 60b lose the magnetism by the thermal processing for the semi-curing.

Subsequently, as shown in FIG. 22, a metal mask 53 is placed on the photosensitive resin 51. In the metal mask 53, openings 53a larger than the openings 51a are formed in the regions corresponding to the openings 51a of the photosensitive resin 51, and openings 53b, 53c larger than the magnetic patterns 60a, 60b are formed in the regions where the magnetic patterns 60a, 60b are formed. The metal mask 53 is aligned to expose the metal layer 4 in the openings 53a and expose the magnetic patterns 60a, 60b in the openings 53b, 53c.

Subsequently, Ag paste 11 (e.g., trade name: EN4072 from Hitachi chemical Co., Ltd.) as the conductive material is imprinted, filling the openings 53a, 53b, 53c of the metal mask 53 by printing method with a squeegee 12. The Ag paste 11 has the property that after semi-cured, it is solid and does not exhibit the adhesiveness at room temperature, exhibit the adhesiveness at a temperature not lower than a first temperature higher than room temperature, and cures at a temperature not lower than a third temperature higher than the first temperature. Here, for example, the first temperature is about 80° C., and the third temperature is about 130° C. The conductive material in the present embodiment can be, other than the Ag paste, Au paste, Pd paste, Pt paste, their alloy paste or others.

Then, the metal mask 53 is removed, and the Ag paste 11 is semi-cured (so called B-stage cured) at about 80° C.~110° C. to form electrodes 5, first electrodes, electrically connected to the metal layer 4 in the openings 51a of the photosensitive resin 51. When the temperature at which the magnetic paste 59 semi-cures, and the temperature at which the Ag paste 11 semi-cures are near to each other, the Ag paste 11 and the magnetic paste 59 may be concurrently semi-cured.

Figure 23A:
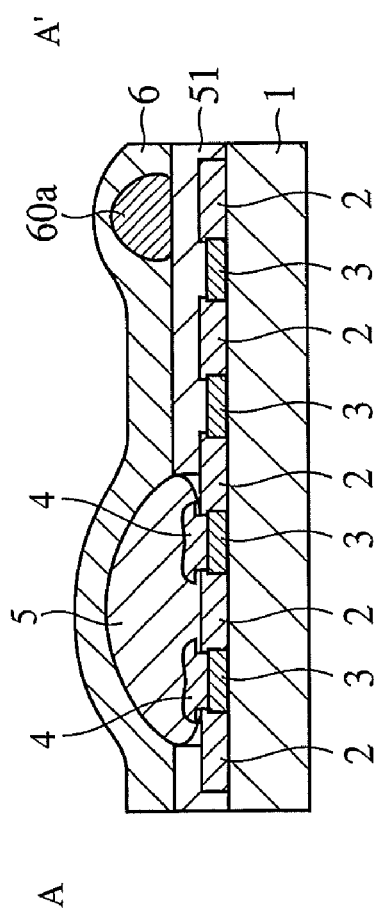
FIGS. 23A and 23B are schematic views showing the method for fabricating an RFID according to the seventh embodiment of the present invention (Part 5).
Figure 23B:
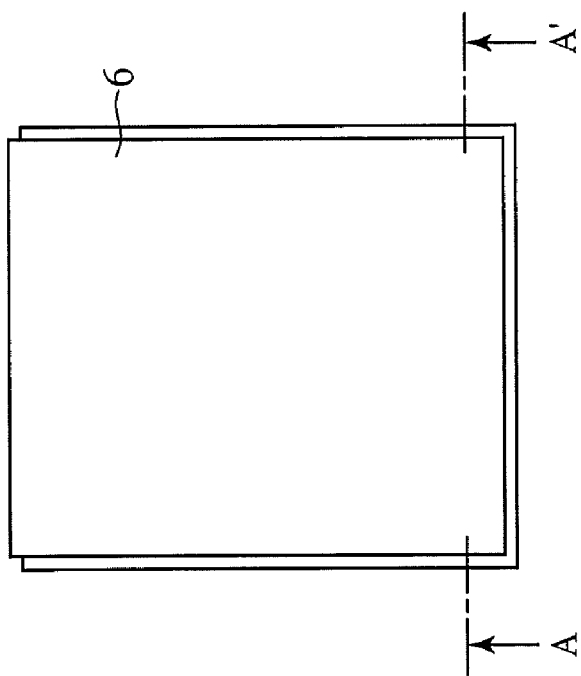

Subsequently, as shown in FIG. 23, an insulating film 6 of an adhesive insulating material is formed, covering the electrodes 5 and the magnetic patterns 60a, 60b. The insulating material has the property that it is solid and does not exhibit the adhesiveness at room temperature, exhibits the adhesiveness at a temperature not lower than a second temperature higher than room temperature, and cures at a temperature not lower than a fourth temperature higher than the second temperature. The insulating material which has cured at a temperature not lower than the fourth temperature retains cured-state at room temperature. The second temperature is about 110° C., and the fourth temperature is about 130° C. In the present embodiment, the insulating material is epoxy resin film-like adhesive and a B-stage adhesive as in the first embodiment.

Figure 24A:
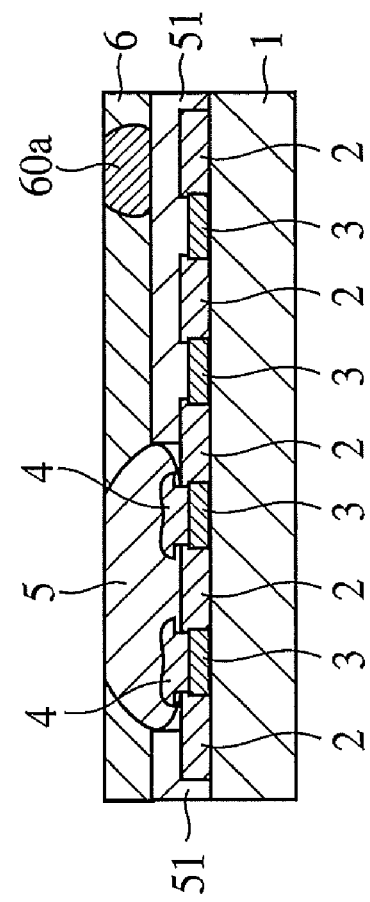
FIGS. 24A and 24B are schematic views showing the method for fabricating an RFID according to the seventh embodiment of the present invention (Part 6).
Figure 24B:
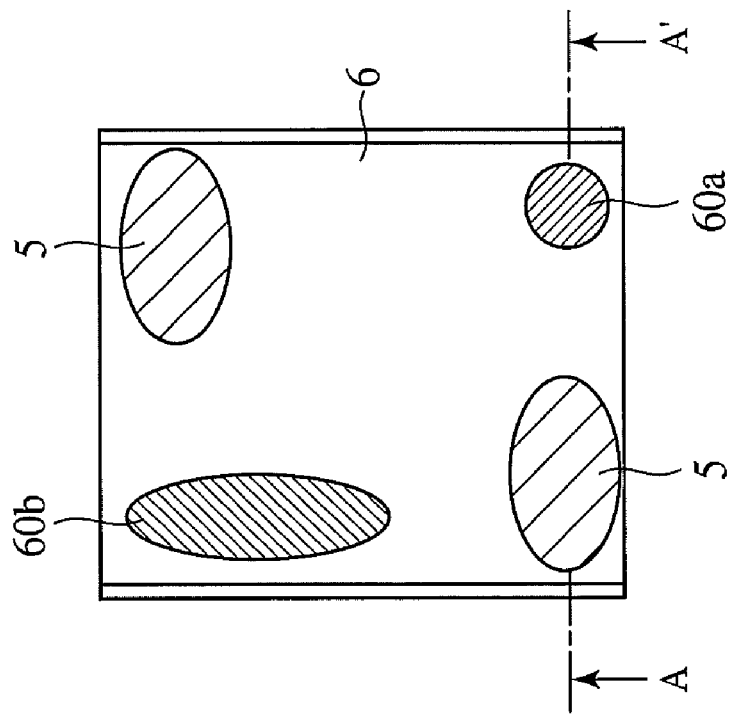

Then, as shown in FIG. 24, cutting is conducted with a hard cutting tool 100 of diamond or others of the cutting apparatus shown in FIG. 2 to make the surfaces of the electrodes 5, the surfaces of the magnetic patterns 60a, 60b and the surface of the insulating film 6 of the semiconductor chip 1a continuously flat. This planarization of the surfaces makes the height of the electrodes 5 and the magnetic patterns 60a, 60b uniform.

In this cutting step, in the present embodiment, the electrodes 5 and the insulating film 6 are cut while being retained solid throughout the cutting step without being softened. That is, the temperature of the semiconductor chip 1a is set at a temperature lower than 80° C., which is the lower value of the first temperature and the second temperature (e.g., 50° C.) and temperatures of the electrodes 5 and the insulating film 6 increased by the frictional heat generated in the cutting with the cutting tool 100 are controlled to be lower than 80° C., whereby the planarization is made with the temperature range lower than 80° C. being retained throughout the cutting step.

This planarization exposes the cut surfaces of the electrodes 5 and the magnetic patterns 60a, 60b enclosed by the insulating film 6 on the surface of the semiconductor chip 1a. At this time, the electrodes 5, the magnetic patterns 60a, 60b and the insulating film 6 can be relatively discriminated from each other by a prescribed reflectivity measuring apparatus or a camera apparatus, based on the reflectivity differences and the color tone differences of the respective surfaces. Accordingly, as described above, this allows an opaque insulating material to be used as the insulating material of the insulating film 6 as described above. The insulating film 6, which is opaque, makes it impossible to look into the inside of the insulating film 6 from the surface of the planarized semiconductor chip 1a, whereby illegal rewriting, etc. of the memorized information, such as rewriting of ROM contents, etc. can be precluded.

Subsequently, semiconductor chips 1a are discretely cut out from the semiconductor wafer 20. At this time, the magnetic patterns 60a, 60b formed on the semiconductor chips 1a have no magnetism, and the inconvenience of the semiconductor chips 1a are attracted to each other does not take place.

Figure 25:
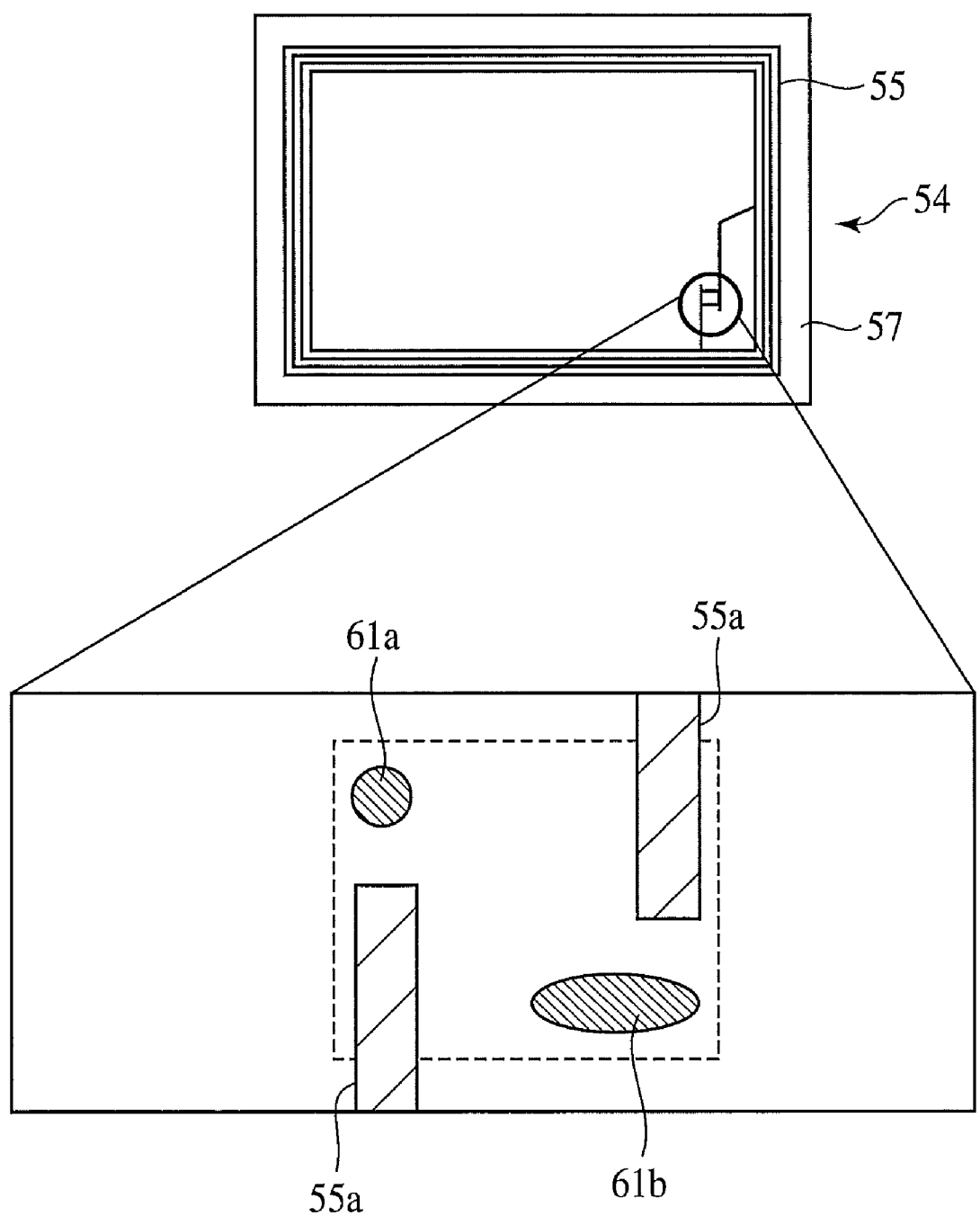
FIG. 25 is schematic views showing the method for fabricating an RFID according to the seventh embodiment of the present invention (Part 7).

Independent of the fabrication of the semiconductor chip 1a described above, the RFID antenna unit 54 is fabricated. As shown in FIG. 25, an antenna 55 is formed on one surface of the base material 57 with coiling, and antenna terminals 55a to be connected to the semiconductor chip 1a are provided. The material of the antenna is copper foil, gold foil, aluminum foil, copper wire, silver wire, gold wire, silver ink, gold ink, palladium ink or others. The RFID antenna unit 54 is preferably a web or tape substrate in terms of the fabrication.

In the present embodiment, on such RFID antenna unit 54, magnetic patterns 61a, 61b, which are mirror images to the magnetic patterns 60a, 60b formed on the semiconductor chip 1a, are further formed. The magnetic patterns 61a, 61b are formed of the same magnetic paste or magnetic ink as the magnetic patterns 60a, 60b, by printing method. The magnetic patterns 61a, 61b are arranged such that when the magnetic patterns 60a, 60b on the semiconductor chip 1a, and the magnetic patterns 61a, 61b on the RFID antenna unit 54 are opposed to each other, the electrodes 5 on the semiconductor chip 1a, and the antenna terminals 55a on the RFID antenna unit 54 are connected to each other.

The magnetic patterns 61a, 61b are formed of a magnetic material having the Curie point (Tc) at a temperature not higher than the thermal processing temperature for curing the resin of the electrodes 5 and the resin of the insulating film 6, e.g., 150° C. A magnetic material having the Curie point at 150° C. is, e.g., Ba-based hard ferrite (trade name: XH1) from FDK Corporation. The magnetic patterns 61a, 61b have magnetism on the RFID antenna unit 54 before connected to the semiconductor chip 1a.

Figure 26A:
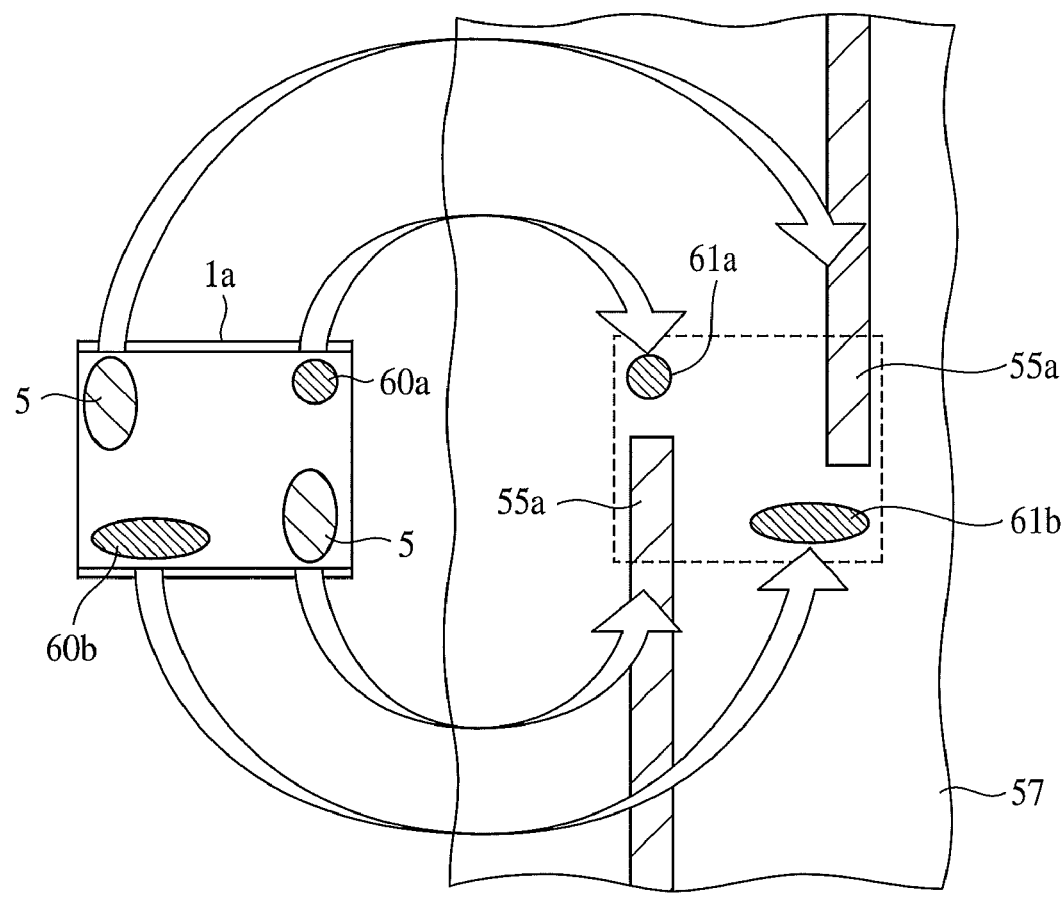
FIGS. 26A and 26B are schematic views showing the method for fabricating an RFID according to the seventh embodiment of the present invention (Part 8).
Figure 26B:
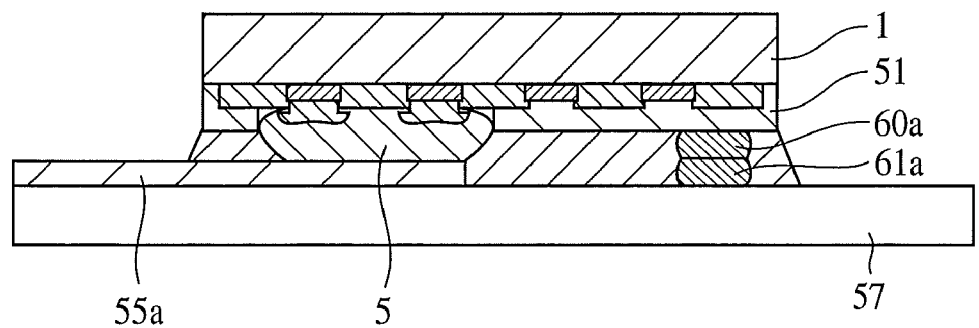

Subsequently, as shown in FIGS. 25 and 26, the semiconductor chip 1a and the RFID antenna unit 54 are connected to each other.

For example, first, the RFID antenna unit 54 is passed near the semiconductor chip 1a while being vibrating. The magnetic patterns 61a, 61b provided on the RFID antenna unit 54, which have magnetism, attract the magnetic patterns 60a, 60b of the semiconductor chip 1a. At this time, the magnetic pattern 60a and the magnetic pattern 61a, which correspond to each other in the shape, and the magnetic pattern 60b and the magnetic pattern 61b, which correspond to each other in the shape, respectively adhere to each other. Thus, the electrodes 5 formed on the semiconductor chip 1a and the antenna terminals 55a formed on the RFID antenna unit 54 are self-aligned with each other (see FIG. 26A).

Subsequently, with the semiconductor chip 1a and the RFID antenna unit 54 set at a temperature not lower than above the softening temperatures of the electrodes 5 and the insulating film 6, i.e., 100° C. which is the higher value of the first temperature and the second temperature, and not higher than the solidifying (curing) temperatures of the electrodes 5 and the insulating film, i.e., 130° C. which is the lower value of the third temperature and the fourth temperature, the electrodes 5 and the antenna terminals 55a are opposed to each other, the insulating film 6 is softened to be buried between the electrodes 5 and the antenna terminals 55a, and the electrodes 5 and the antenna terminals 55a are contacted to each other.

At this time, it is also possible that the temperature of the semiconductor chip 1a is set at a temperature lower than a temperature below 80° C. which is the lower value of the respecting softening temperatures of the electrodes 5 and the insulating film 6 while the temperature of the RFID antenna unit 54 is set at a temperature higher than 110° C. of the higher value of the respective softening temperatures of the electrodes 5 and the insulating film 6, and in this state, with electrodes 5 and the antenna terminals 55a opposed to each other in contact with each other, the temperatures of the electrodes 5 and the insulating film 6 are raised to not lower than 110° C. to thereby soften the electrodes 5 and the insulating film 6.

In this state, the semiconductor chip 1a and the RFID antenna unit 54 are pressed against each other at a temperature not lower than a temperature of the higher value of the third temperature and the fourth temperature and the Curie point of the magnetic material contained in the magnetic patterns 61a, 61b, e.g., 150° C. under a load of several gfs per one electrode, e.g., 10 gf for a prescribed period of time to cure the conductive material of the electrodes 5, the magnetic material of the magnetic patterns 60a, 60b, 61a, 61b and the insulating material of the insulating film 6. Then, the semiconductor chips 1a and the RFID antenna unit 54 are further sustained at 150° C. for about 30 minutes to completely cure the conductive material and the insulating material. Thus, the semiconductor chip 1a and the RFID antenna unit 54 are connected to each other by the insulating film 6 while the electrodes 5 and the antenna terminals 55a are connected to each other (see FIG. 26). At this time, the electrodes 5 and the antenna terminals 55a are electrically connected for the conduction while the insulating film 6 is strongly adhered by its good adhesiveness, and connection between the semiconductor chip 1a and the RFID antenna unit 54 is ensured. The magnetic patterns 61a, 61b are exposed to a temperature above the Curie point and lose the magnetism.

Then, the step of forming a protection film (not shown), etc. are conducted, and when the RFID antenna units 54 are a web or tape, the RFID antenna units 54 are discretely. At this time, an inconvenience that the cut RFID antenna units 54 adhere to each other does not take place because the magnetic patterns 60a, 60b, 61a, 61b do not have the magnetism.

Thus, the RFID or the noncontiguous IC card is completed.

As described above, according to the present embodiment, the metal terminals the height of which is a uniform height and which are flat can be formed at low costs and under low load, which enable the mounting with low damage, and the RFID or noncontiguous IC card of high reliability can be formed. When the electrodes 5 are formed, openings of an arbitrary size for exposing the arbitrary parts of the metal layers 3 are formed in the photosensitive resin 51, whereby the metal layers 4 can be formed only on the arbitrary parts of the metal layers 3 to thereby form the electrodes 5. This allows necessary regions of the metal layers 3 to be selected to form the electrodes 5, forming no unnecessary electrodes, which makes it possible to efficiently fabricate semiconductor chips.

The use of the magnetic pattern permits the alignment of the semiconductor chip 1a with the RFID antenna unit to be self-aligned, which makes the connection of the semiconductor chip with the RFID antenna unit easy and speedy. This much decrease the fabrication cost.

In the present embodiment, the above-described cutting is applied only to one primary surface of a semiconductor chip 1a, but one primary surface of the RFID antenna unit 54 is not subjected to the cutting and may have antenna terminals 55a made continuously flat to some extent. However, the RFID antenna unit 54 may have said one primary surface cut flat, as has the semiconductor chip 1a.

On the stage of, e.g., the metal layers 3 having been formed on the semiconductor chips 1a, the respective semiconductor chips 1a are tested with test terminals (not shown), and a releasable resin, which prevents the conductive resin adhering to the surface, is applied to those of the semiconductor chips 1a judged defective by the test result so that when the Ag paste 11, which is the material of the electrodes 5, is applied, the conductive resin is not adhered to such semiconductor chips 1a. The defective semiconductor chips 1a may be discriminated from the normal semiconductor chips 1a.

Similarly, on the stage of, e.g., the metal layers 3 having been formed on semiconductor chips 1a, the respective semiconductor chips 1a are tested with test terminals (not shown), and a resin whose color tone is different from the insulating film 6 is dropped to, e.g., the central parts of the surfaces of those of the semiconductor chips 1a judged defected by the test result, whereby the defective semiconductor chips 1a are discriminated from the normal semiconductor chips 1a.

When the insulating film 6 is formed, the indication regions (e.g., fabrication number regions) of a semiconductor wafer 20 for the semiconductor chips 1a are masked with a tape (not shown) of an adhesive material which does not cure at the first temperature. In this state, the insulating film 6 is formed. Then, the tape is removed before a second temperature is applied. Thus, the fabrication number regions are not covered with the insulating resin of the insulating film 6 and suitable functions as the indication regions.

In the present embodiment, the insulating film 6 is formed in a single layer. However, the insulating film may be formed in two layers, as in, e.g., in the second embodiment. The electrodes 5 containing cores, as of, e.g., stud bumps, bump electrodes or others, may be formed, as in the fourth or the fifth embodiment.

What is claimed is:

1. A method for processing a base comprising:
   forming over a first base a first magnetic pattern containing a first magnetic material which is not magnetized;
   forming over a second base a second magnetic pattern containing a second magnetic material which is magnetized;
   opposing a surface of the first base having the first magnetic pattern formed thereon and a surface of the second base having the second magnetic pattern formed thereon to each other, aligning the first base and the second base by a magnetic force exerted between the first magnetic pattern and the second magnetic pattern and connecting the first base and the second base to each other; and
   thermally processing at a temperature higher than a Curie point of the second magnetic material to unmagnetize the second magnetic material.

2. The method for processing a base according to claim 1, wherein forming the first magnetic pattern comprises:
   depositing on the first base a magnetic paste containing fine particles of the first magnetic material in an adhesive resin; and
   making a thermal processing at a temperature higher than a Curie point of the first magnetic material to unmagnetize the first magnetic material while semi-curing the magnetic paste to form the first magnetic pattern.

3. The method for processing a base according to claim 1, wherein forming the second magnetic pattern comprises:
   depositing on the second base a magnetic paste containing fine particles of the second magnetic material in an adhesive resin; and
   making a thermal processing at a temperature lower than the Curie point of the second magnetic material to semi-cure the magnetic paste while forming the second magnetic pattern.

4. The method for processing a base according to claim 1, further comprising:
   forming a first electrode over the first base;
   forming an insulating film over the first base with the first electrode and the first magnetic pattern formed thereon; and
   cutting the surface of the first base with the first electrode and the insulating film formed thereon to expose the first electrode on the surface while planarizing the surface.

5. The method for processing a base according to claim 4, wherein forming the first electrode comprises:
   depositing over the first base a conductive paste with fine particles of a conductive material kneaded in an adhesive resin; and
   semi-curing the conductive paste by a thermal processing to form the first electrode,
   forming the insulating film includes,
   forming an adhesive insulating material over the first base; and
   semi-curing the insulating material by a thermal processing to form the insulating film,
   and the connecting the first base and the second base to each other is conducted at a temperature at which the semi-cured first electrode and the insulating film soften and exhibit the adhesiveness, and
   the unmagnetizing the second magnetic material is conducted at a temperature at which the first electrode and the insulating film are cured.

6. The method for processing a base according to claim 1, wherein
   in the connecting the first base and the second base, the first magnetic pattern and the second magnetic pattern are arranged so that the first base and the second base are aligned with each other by a magnetic force exerted between the first magnetic pattern and the second magnetic pattern to thereby connect the first electrode formed on the first base and the second electrode formed on the second base to each other.

7. The method for processing a base according to claim 1, wherein
   the first magnetic pattern and the second magnetic pattern are mirror images to each other.

* * * * *